US007622783B2

(12) United States Patent
Carlson et al.

(10) Patent No.: US 7,622,783 B2
(45) Date of Patent: Nov. 24, 2009

(54) MEMS THERMAL ACTUATOR AND METHOD OF MANUFACTURE

(75) Inventors: Gregory A. Carlson, Santa Barbara, CA (US); John S. Foster, Santa Barbara, CA (US); Christopher S. Gudeman, Lompoc, CA (US); Paul J. Rubel, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 147 days.

(21) Appl. No.: 11/705,739

(22) Filed: Feb. 14, 2007

(65) Prior Publication Data

US 2008/0191303 A1 Aug. 14, 2008

(51) Int. Cl.
*H01L 29/82* (2006.01)

(52) U.S. Cl. ....................... 257/415; 257/108; 257/428; 257/E29.324; 438/50; 438/52

(58) Field of Classification Search ................. 257/108, 257/415, 428; 438/50, 52
See application file for complete search history.

(56) References Cited

U.S. PATENT DOCUMENTS

| | | | | |
|---|---|---|---|---|
| 4,696,054 | A | 9/1987 | Tsugei et al. | |
| 4,772,876 | A | 9/1988 | Laud | |
| 4,844,637 | A | 7/1989 | Buisson et al. | |
| 4,853,888 | A | 8/1989 | Lata et al. | |
| 5,164,723 | A | 11/1992 | Nebenzahi | |
| 5,276,794 | A | 1/1994 | Lamb | |
| 5,502,460 | A | 3/1996 | Bowen | |
| 5,594,953 | A | 1/1997 | Ross et al. | |
| 5,760,773 | A | 6/1998 | Berman et al. | |
| 5,962,949 | A | 10/1999 | Dhuler et al. | |
| 6,058,304 | A | 5/2000 | Callaghan et al. | |
| 6,169,789 | B1 | 1/2001 | Rao et al. | |
| 6,209,034 | B1 | 3/2001 | Galdwin et al. | |
| 6,268,806 | B1 | 7/2001 | Frager et al. | |
| 6,480,587 | B1 | 11/2002 | Rao et al. | |
| 6,617,185 | B1 | 9/2003 | Geisberger | |
| 7,303,936 | B2 * | 12/2007 | Chilcott | 438/50 |
| 7,406,761 | B2 * | 8/2008 | Jafri et al. | 29/831 |
| 2002/0021053 | A1 | 2/2002 | Wood et al. | |
| 2003/0024243 | A1 | 2/2003 | Gianchandani et al. | |
| 2004/0166602 | A1 | 8/2004 | Wang et al. | |
| 2004/0211178 | A1 * | 10/2004 | Menard et al. | 60/527 |
| 2004/0261412 | A1 | 12/2004 | Hickey | |
| 2005/0146404 | A1 | 7/2005 | Yeatman | |
| 2005/0282151 | A1 | 12/2005 | Foster et al. | |
| 2006/0062698 | A1 | 3/2006 | Foster et al. | |

* cited by examiner

*Primary Examiner*—Wai-Sing Louie
(74) *Attorney, Agent, or Firm*—Jaquelin K. Spong

(57) ABSTRACT

A separated MEMS thermal actuator is disclosed which is largely insensitive to creep in the cantilevered beams of the thermal actuator. In the separated MEMS thermal actuator, a inlaid cantilevered drive beam formed in the same plane, but separated from a passive beam by a small gap. Because the inlaid cantilevered drive beam and the passive beam are not directly coupled, any changes in the quiescent position of the inlaid cantilevered drive beam may not be transmitted to the passive beam, if the magnitude of the changes are less than the size of the gap.

16 Claims, 21 Drawing Sheets

MEMS THERMAL ACTUATOR AND METHOD OF MANUFACTURE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a microelectromechanical systems (MEMS) thermal device, and its method of manufacture. More particularly, this invention relates to a MEMS thermal actuator whose driving means is separated from a passive member by a small gap.

Microelectromechanical systems (MEMS) are very small moveable structures made on a substrate using lithographic processing techniques, such as those used to manufacture semiconductor devices. MEMS devices may be moveable actuators, valves, pistons, or switches, for example, with characteristic dimensions of a few microns to hundreds of microns. A moveable MEMS switch, for example, may be used to connect one or more input terminals to one or more output terminals, all microfabricated on a substrate. The actuation means for the moveable switch may be thermal, piezoelectric, electrostatic, or magnetic, for example.

FIG. 1 shows an example of a prior art thermal switch, such as that described in U.S. Patent Application Publication 2004/0211178 A1. The thermal switch 10 includes two cantilevers, 100 and 200. Each cantilever 100 and 200 contains a passive beam 110 and 210, respectively, which pivot about fixed anchor points 155 and 255, respectively. A conductive drive circuit 120 and 220, is coupled to each passive beam 110 and 210 by a plurality of dielectric tethers 150 and 250; respectively.

When a voltage is applied between terminals 130 and 140, a current is driven through conductive circuit 120. The Joule heating generated by the current causes the circuit 120 to expand relative to the unheated passive beam 110. Since the circuit is coupled to the passive beam 110 by the dielectric tether 150, the expanding conductive circuit drives the passive beam in the upward direction 165.

In addition, applying a voltage between terminals 230 and 240 causes heat to be generated in circuit 220, which drives passive beam 210 in the direction 265 shown in FIG. 1. Therefore, one beam 100 moves in direction 165 and the other beam 200 moves in direction 265. These movements may be used to open and close a set of contacts located on contact flanges 170 and 270, each in turn located on tip members 160 and 260, respectively, at the distal ends of passive beams 110 and 210. The sequence of movement of contact flanges 170 and 270 on tip members 160 and 260 of switch 10 is shown in FIGS. 2*a*-2*d*, to close and open the electrical switch 10.

To begin the closing sequence, in FIG. 2*a*, tip member 160 and contact flange 170 are moved about 10 μm in the direction 165 by the application of a voltage between terminals 130 and 140. In FIG. 2*b*, tip member 260 and contact flange 270 are moved about 17 μm in the direction 265 by application of a voltage between terminals 230 and 240. In FIG. 2*c*, tip member 160 and contact flange 170 are brought back to their initial position by removing the voltage between terminals 130 and 140. This stops current from flowing and cools the cantilever 100 and it returns to its original position. In FIG. 2*d*, tip member 260 and contact flange 270 are brought back to nearly their original position by removing the voltage between terminals 230 and 240. However, in this position, tip member 160 and contact flange 170 prevent tip member 260 and contact flange 270 from moving completely back to their original positions, because of the mechanical interference between contact flanges 170 and 270. In this position, contact between the faces of contact flanges 170 and 270 provides an electrical connection between cantilevers 100 and 200, such that in FIG. 2*d*, the electrical switch is closed. Opening the electrical switch is accomplished by reversing the movements in the steps shown in FIGS. 2*a*-2*d*.

SUMMARY

If either one of cantilevers 100 or 200 fails to return to its initial position upon the cessation of the drive current, then contact flange 170 or 270 may remain in the path of the other contact, causing MEMS switch 10 to fail to open or close properly. Because the cantilevers 110, 120, 210 and 220 are generally made from a metal material such as nickel deposited or plated over a substrate surface, they are subject to creep. Creep may occur as a result of heating the cantilevers 110, 120, 210 or 220, when the grain boundaries within the metal films may migrate to new locations, such that the metal beam does not relax to exactly its initial position. Creep may cause the MEMS switch to fail or become unreliable in its opening and closing performance, because the contact flanges 170 or 270 may fail to return to their initial positions.

A separated MEMS thermal actuator is described, which includes a cantilevered passive beam that is not directly connected to the cantilevered driving circuit when the actuator is not being driven by a current. Instead, the driving circuit is separated from the passive beam by a narrow gap in the quiescent state. When the driving circuit is energized by a current, it expands because of its increased temperature; closes the gap and begins to drive the passive beam. When the driving circuit cools, it may suffer some creep, and may not return to exactly its initial position. However, since it is not connected to the passive beam in the quiescent state, its altered final position does not alter the final position of the passive beam, if that altered position can be accommodated by the separation distance of the gap designed into the separated MEMS thermal actuator. Accordingly, the separation distance of the gap between the cantilevered drive beam and the passive silicon beam is designed to be at least as large as the expected amount of creep that the cantilevered drive beam is likely to experience.

In addition, the passive beam may be made from single crystal silicon, such as the device layer of a silicon-on-insulator (SOI) substrate. Single crystal silicon may have exceedingly low creep, as well as other advantageous mechanical characteristics. The passive drive beam may be formed in this single crystal device layer of a SOI substrate. In order to drive the passive beam, the cantilevered driving circuit may be an metal material inlaid into the device layer, inlaid such that the axis of the cantilevered drive beam lies substantially in the plane of device layer and therefore in the plane of the passive silicon beam. The MEMS actuator therefore has very low creep and higher reliability than the prior art actuators such as that shown in FIG. 1.

Embodiments of the MEMS actuator are described, which may include an additional metal plated over the single crystal silicon passive beam as a contact electrode, which may carry the signal being switched. This metal may be chosen to have particularly low contact resistance and good electrical transport properties compared to the silicon passive beam. In one exemplary embodiment, the additional metal electrode material may be gold (Au). The additional metal contact electrode may be formed in such a shape as to add relatively little stiffness to the passive beam, such that it does not substantially affect the return of the passive beam to its initial position, or its deflection as a function of the current in the cantilevered drive beam.

Electrical isolation may be needed between the cantilevered drive beam and the silicon passive beam and the additional metal electrode, so that the drive current for the cantilevered drive beam does not flow through the signal line. To provide electrical isolation, the inlaid cantilevered drive beam may be coupled to a dielectric material, which is then coupled to an adjunct silicon member, wherein the adjunct silicon member makes contact with the passive beam when the inlaid cantilevered drive beams are energized. Accordingly, the inlaid cantilevered drive beam may be electrically isolated from the passive beam and the additional metal electrode carrying the signal by the dielectric material, even when the inlaid cantilevered drive beam is energized and thus the separation gap is closed.

These and other features and advantages are described in, or are apparent from, the following detailed description.

BRIEF DESCRIPTION OF THE DRAWINGS

Various exemplary details are described with reference to the accompanying drawings, which however, should not be taken to limit the invention to the specific embodiments shown but are for explanation and understanding only.

DETAILED DESCRIPTION

A separated MEMS thermal actuator is described, which includes a passive cantilevered beam that is not directly coupled to a cantilevered driving circuit when the driving circuit is not energized. Instead, the driving circuit is separated from the passive beam by a narrow gap. When the driving circuit is energized, it expands to close the gap, making contact with the passive beam and driving it to its actuated position. The actuated position may be one in which electrical contact flanges disposed on the distal ends of two substantially perpendicular passive beams are in contact, thereby closing an electrical switch. However, it should be understood that the switch described is only one exemplary embodiment, and the separated MEMS thermal actuator may be used in various other devices, such as valves, pistons, optical devices, fluidic devices and numerous other devices using actuators. The separated MEMS thermal actuator is also described with respect to an embodiment using a silicon-on-insulator substrate, wherein the insulating layer is silicon dioxide. However, it should be understood that the systems and methods described here may be applied to other types of SOI wafers with other dielectric materials between the silicon layers.

Figure 1:
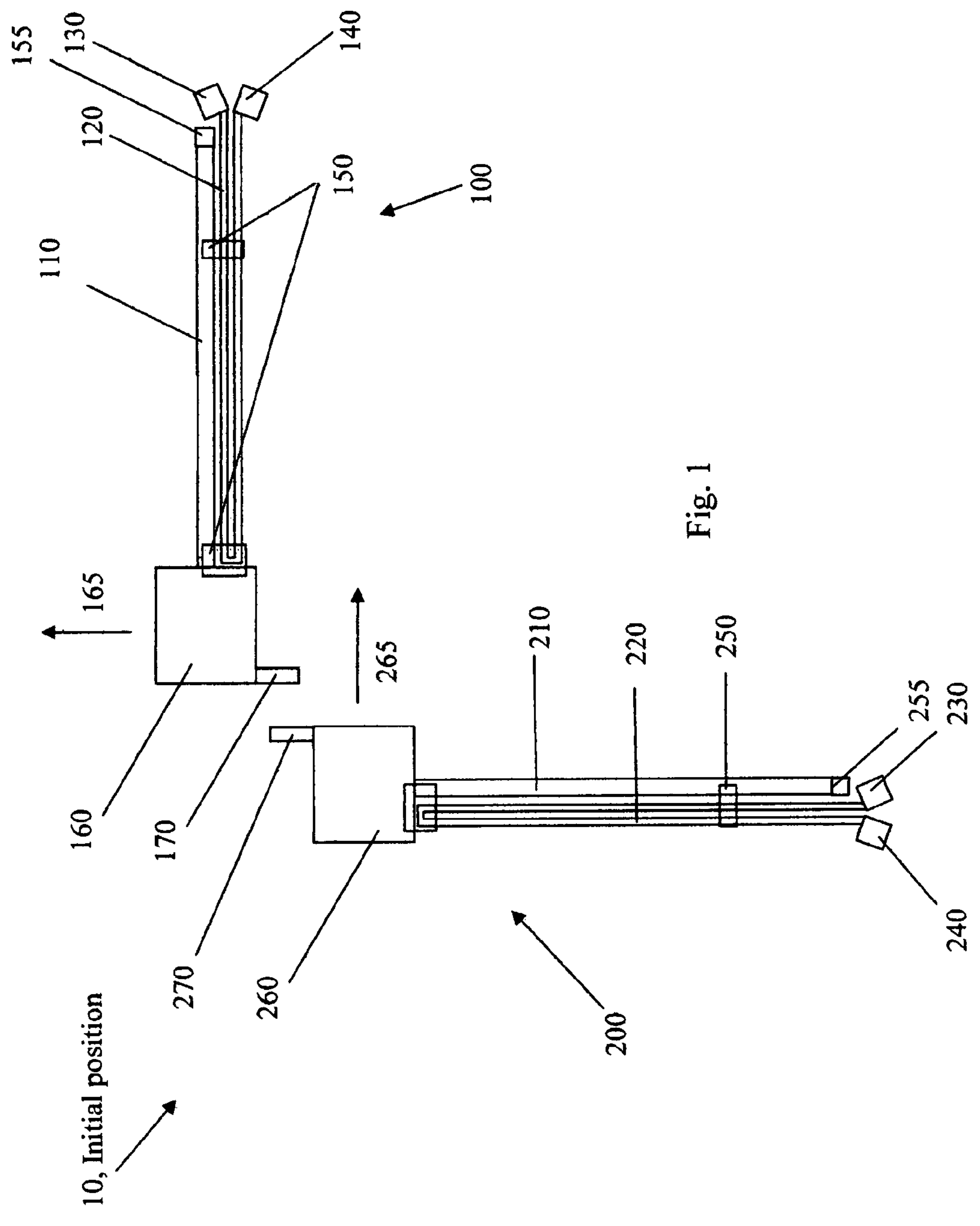
FIG. 1 is a schematic view of a prior art MEMS thermal switch.
Figure 2A:
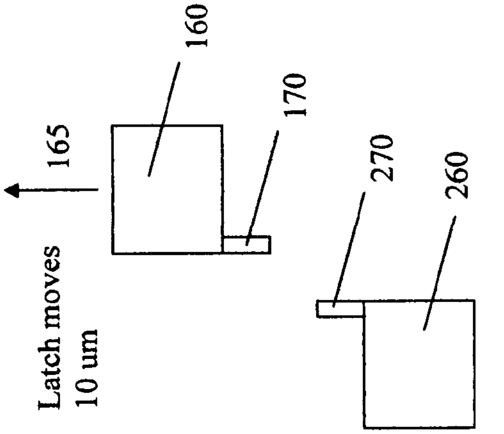
FIGS. 2*a*-2*d* are diagrams illustrating the sequence of movements required to close the switch illustrated in FIG. 1.
Figure 2B:
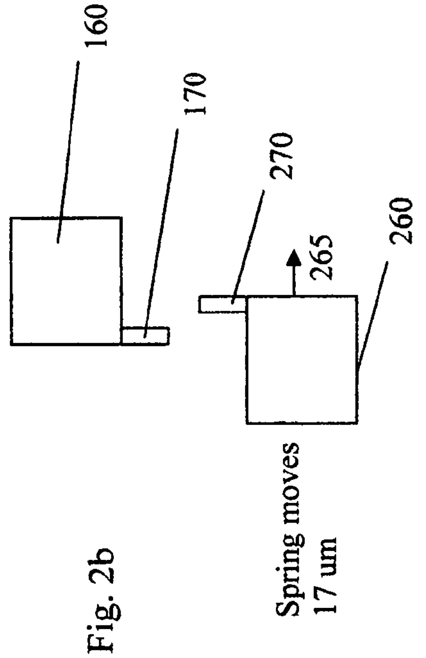
Figure 2C:
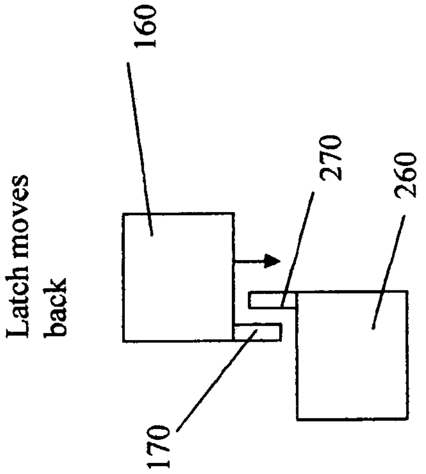
Figure 2D:
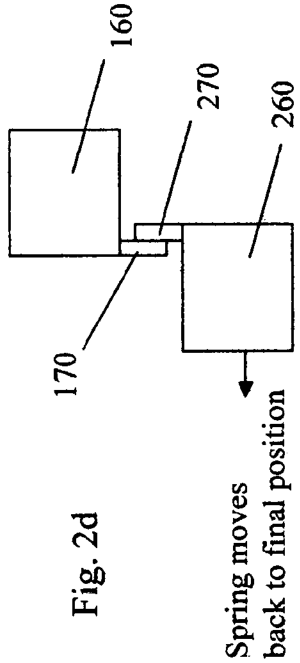
Figure 3:
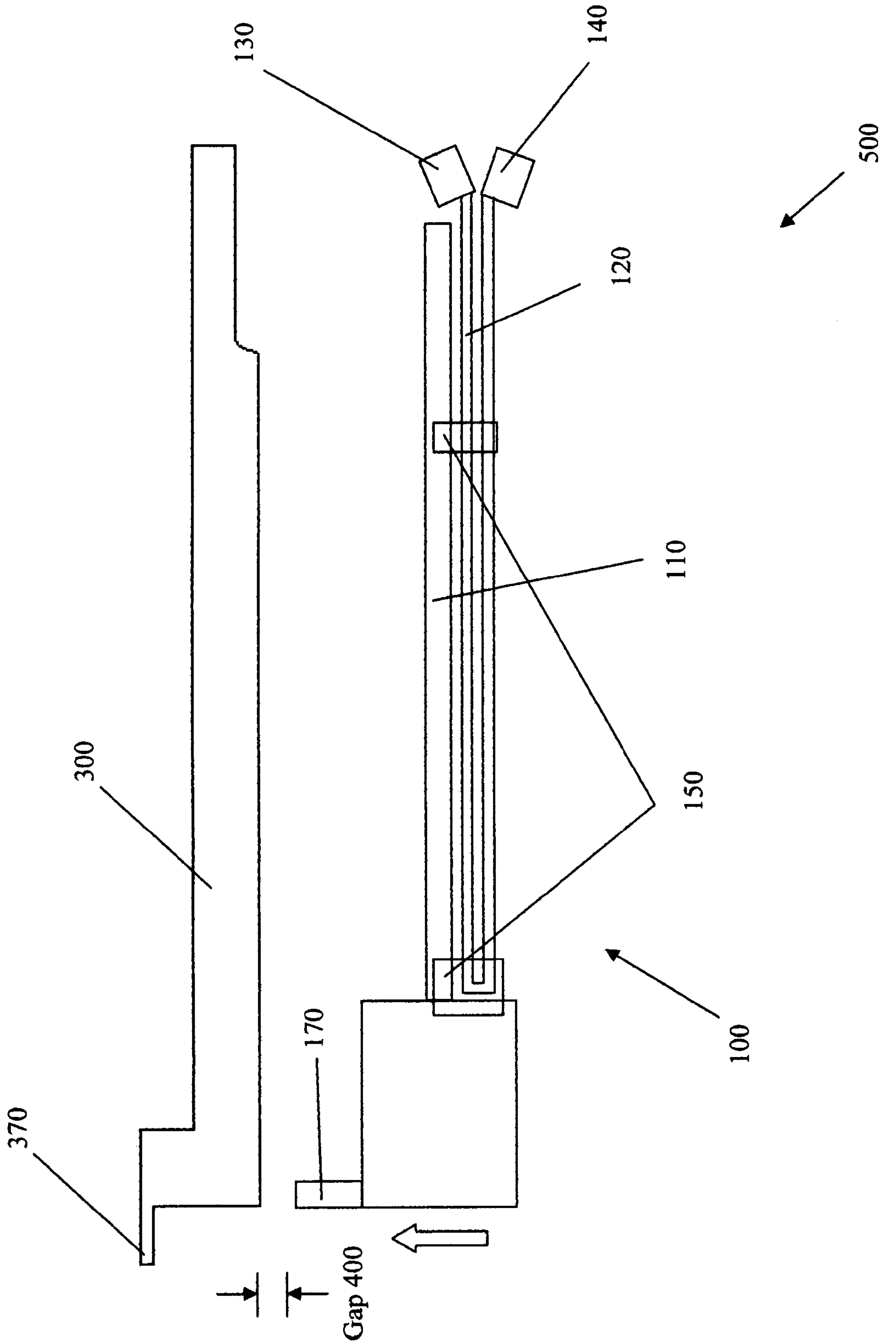
FIG. 3 is a diagram illustrating a first exemplary embodiment of a separated MEMS thermal actuator.

FIG. 3 is a diagram illustrating a first exemplary embodiment of a separated MEMS thermal actuator 500. Separated MEMS thermal actuator 500 includes two substantially independent cantilevered beams 100 and 300. Actuator 100 is substantially similar to actuator 100 in FIG. 1, except that instead of closing switch 10 itself, it instead drives passive beam 300, from which it is separated by a small gap 400. Passive beam 300 is equipped with a contact flange 370, which is adjacent to another contact flange (not shown) in order to close the switch. When the contact flange 370 rests against the adjacent flange; the switch is closed in a fashion similar to the operation of MEMS switch 10, illustrated in FIGS. 2*a*-2*d*.

The advantage of using separated MEMS thermal actuator 500 in a switch such as MEMS switch 10, is that separated MEMS thermal actuator 500 has substantially lower creep, because when beam 100 relaxes, it is no longer in contact with passive beam 300. Accordingly, if MEMS cantilever 100 creeps to a new position upon cessation of the driving current, the position of passive beam 300 will be unaffected, as long as the change in position is smaller than the gap 400. Accordingly, a MEMS switch 10 using separated MEMS thermal actuator 500 may have higher reliability than MEMS switch 10 using MEMS actuators 100 and 200.

However, separated MEMS thermal actuator 500 is also not ideal because it has relatively low efficiency, because the actuator 500 includes two passive beams 110 and 300. Because of the combined stiffnesses of these two passive beams 110 and 300, the deflection of separated MEMS thermal actuator 500 for a given input drive current may be reduced, thereby reducing the efficiency of separated MEMS thermal actuator 500.

Figure 4:
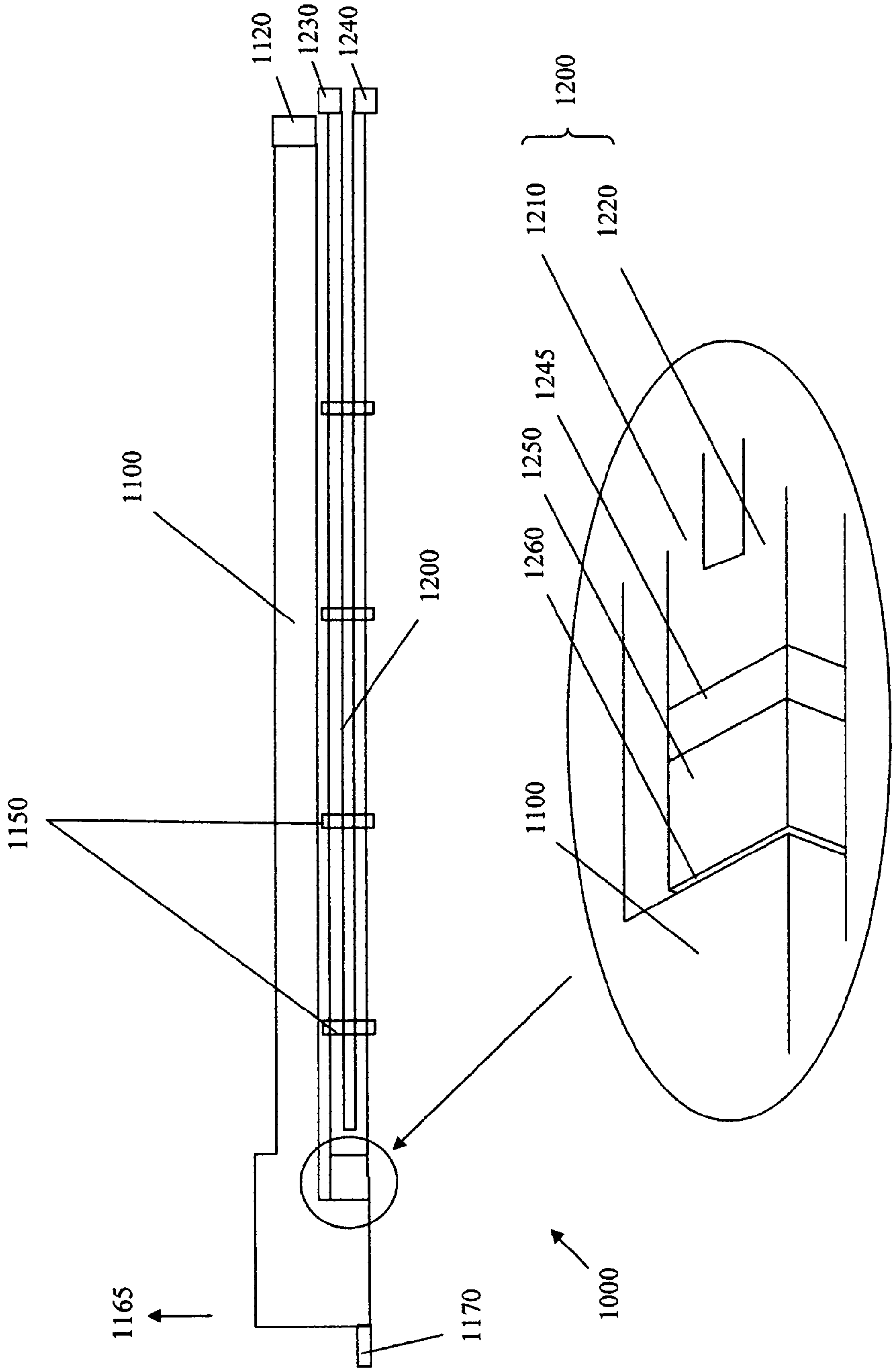
FIG. 4 is a diagram of a second exemplary embodiment of a separated MEMS thermal actuator having a inlaid cantilevered drive beam separate from the passive beam.

FIG. 4 illustrates a second exemplary embodiment of a separated MEMS thermal actuator 1000, wherein the driving circuit 1200 is separated from the passive beam 1100 by a narrow gap 1260. In the second embodiment, the small gap 1260 is located at the distal end of the cantilevered beams 1210 and 1220 of the driving circuit 1200. Separated MEMS thermal actuator 1000 is designed to pivot in direction 1165, when current is applied to cantilevered drive beams 1200 by application of a voltage to contact pads 1230 and 1240, as described further below.

The narrow gap 1260 may be formed between an adjunct portion 1250, and the passive silicon beam 1100. In the examples herein, the adjunct portion 1250 is referred to as being fabricated from silicon, but it may alternatively be made of nickel, inlaid dielectric, or any of a number of other materials. The purpose of the adjunct silicon portion 1250 is to simplify the manufacturing process, as described in greater detail below. The adjunct silicon portion 1250 may be affixed to the distal ends of inlaid cantilevered drive beams 1210 and 1220 by a dielectric material 1245, which keeps current from flowing from the drive circuit 1200 to the adjunct silicon portion 1250 and the passive beam 1100 when they are touching during actuation of separated MEMS thermal actuator 1000.

The cantilevered drive beams 1210 and 1220 may be tethered together by dielectric tethers 1150. However, in contrast to MEMS actuators 100 and 200, dielectric tethers 1150 generally do not tie the cantilevered drive beams 1200 to the passive beam 1100, particularly at the distal end of the cantilevered drive beam 1200. Instead, the passive beam 1100 remains uncoupled to cantilevered drive beams 1200 when the cantilevered drive beams 1200 are in the quiescent state. However, in other exemplary embodiments, the cantilevered drive beams 1200 may be coupled to the passive beam 1100 by dielectric tethers near the proximal end of the cantilevered drive beams 1200. The proximal end of cantilevered drive beams 1200 are the ends nearer to the contact pads and anchor points 1230 and 1240. As used herein, the terms “separated MEMS thermal actuator” should be understood to mean a thermal actuator wherein the distal end of the driving means is not directly coupled to the passive beam in the quiescent state.

When the cantilevered drive beams 1200 are energized by applying a current to contact pads 1230 and 1240, the cantilevered drive beams expand as a result of the Joule heating caused by the current. The expansion of cantilevered drive beams 1200 closes gap 1260 between the passive silicon beam 1100 and the adjunct silicon portion 1250. At this point, the adjunct silicon portion 1250 makes contact with the passive beam 1100, and the cantilevered drive beams 1200 begin to drive the passive silicon beam 1100 in direction 1165 about its anchor point 1120.

Figure 5A:
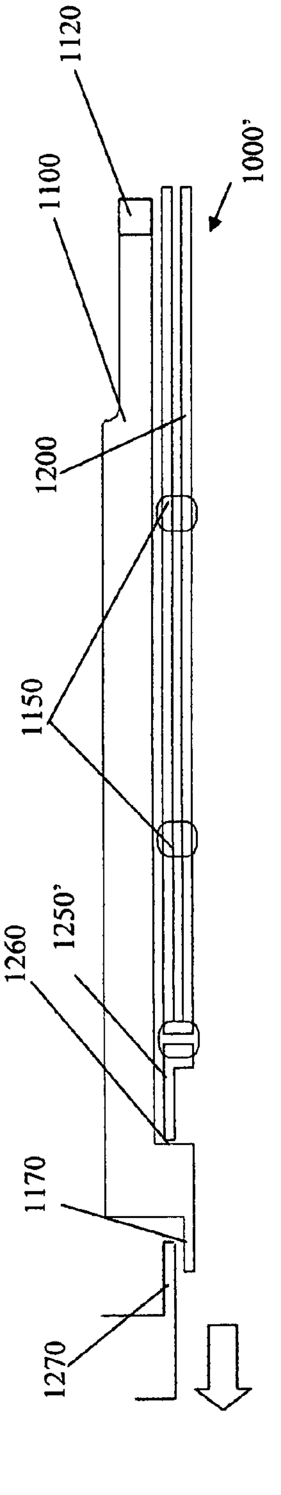
FIGS. 5*a*-5*f* show the activation sequence of closing and opening a switch using the separated MEMS thermal actuator of FIG. 4.
Figure 5B:
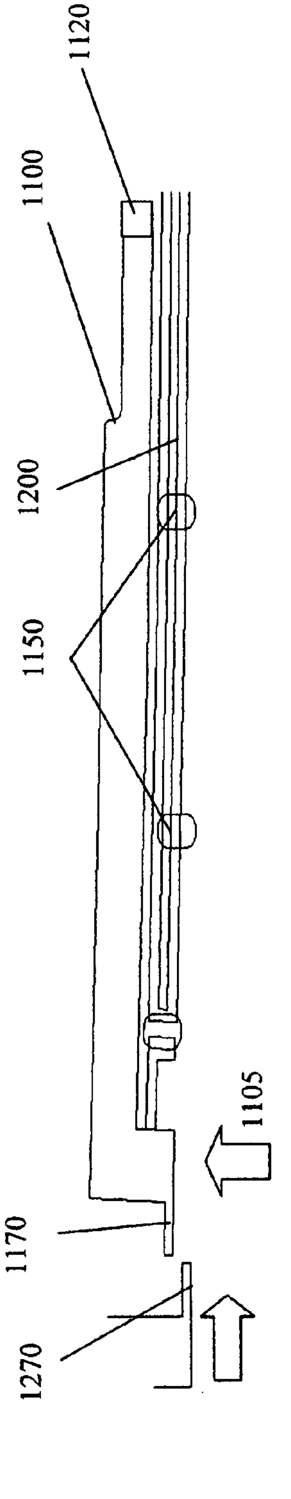
Figure 5C:
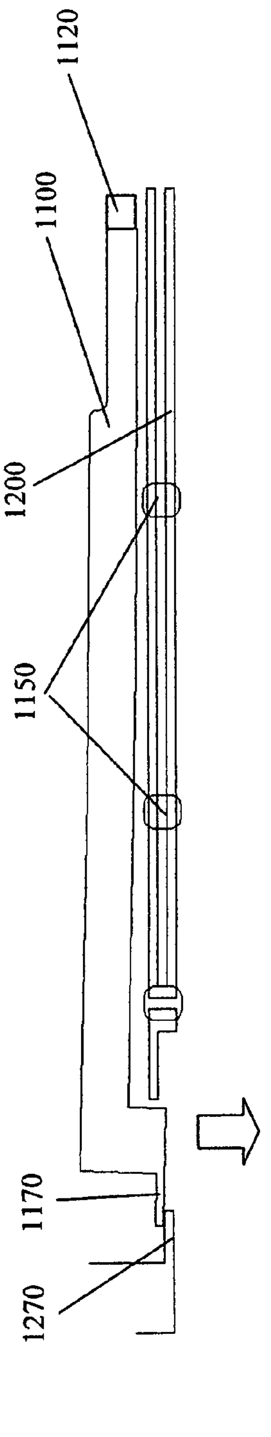

The separated MEMS thermal actuator 1000 may be used to open and close an electrical switch, for example. A portion of an electrical switch using separated MEMS thermal actuator 1000' is shown in an opening and closing sequence in FIGS. 5*a*-5*f*. Separated MEMS thermal actuator 1000' is similar to separated MEMS thermal actuator 1000, except for the detailed shape of the adjunct silicon portion 1250', which in separated MEMS thermal actuator 1000' has a narrower region at the separation gap 1260 than adjunct silicon portion 1250. Although not shown in FIGS. 5*a*-5*f*, it should be understood that the movement of tip contact 1270 may be controlled by another separated MEMS thermal actuator similar in design to separated MEMS thermal actuator 1000'. To close the switch, the adjunct tip contact 1270 is first retracted by actuating its controlling actuator, as shown in FIG. 5*a*. When the tip contact flange 1270 is withdrawn from the path of tip contact flange 1170, actuator 1000' may be activated by applying a current to contact pads 1230 and 1240. The current heats the cantilevered drive beams 1200, causing them to expand and close the gap 1260. After the gap 1260 is closed, the cantilevered drive beams 1200 continue to expand, driving the passive beam 1100 to pivot about its anchor point 1120 and deflect in direction 1105 as shown in FIG. 5*b*. After the passive beam has moved as shown in FIG. 5*b*, the adjacent tip contact flange 1270 is allowed to return to its initial position as shown in FIG. 5*c*. The current is then discontinued to cantilevered drive beams 1200, so that they shrink to nearly their original shape, and leave passive beam 1100 engaged with adjacent tip contact flange 1270, as shown in FIG. 5*c*. In this configuration, the switch may be closed because of contact between tip contact flange 1170 and adjacent tip contact flange 1270.

Figure 5D:
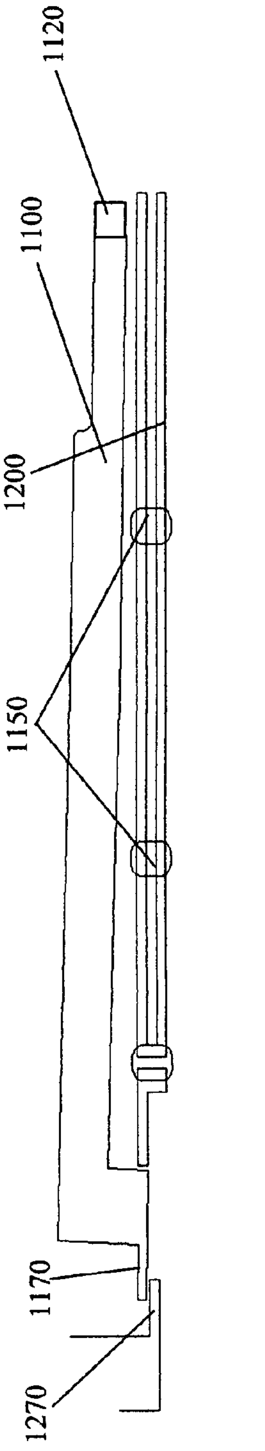
Figure 5E:
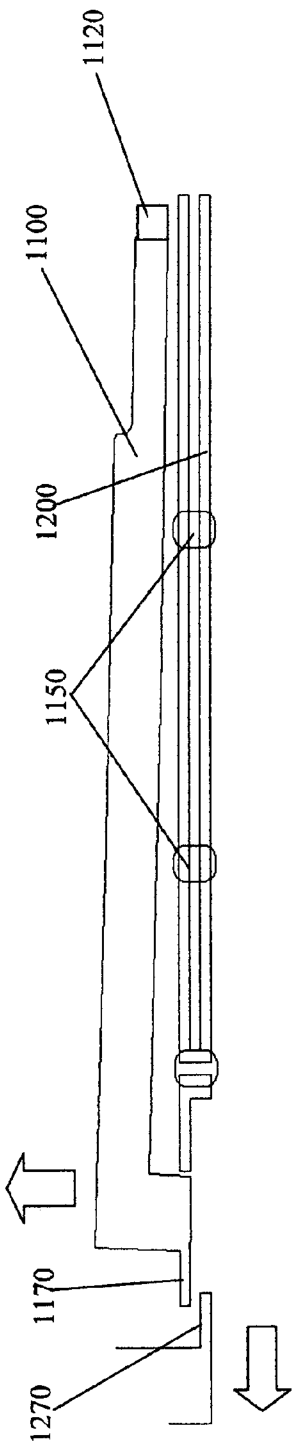
Figure 5F:
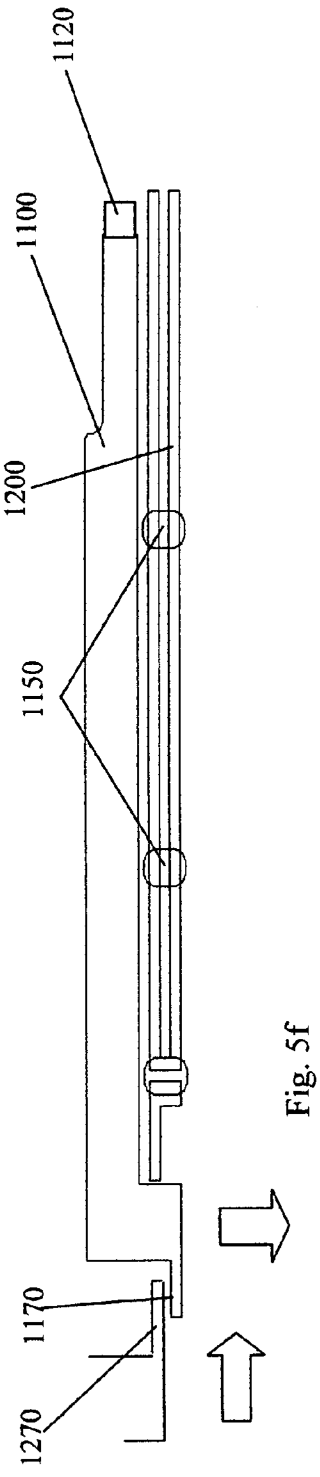

To open the switch, current is again applied to the pads of cantilevered drive beam 1200, heating the drive beam 1200 until it again makes contact with passive beam 1100, as shown in FIG. 5*d*. Because of the expansion of cantilevered drive beam 1200, it closes the gap between adjunct silicon portion 1250' and passive beam 1100. At this point, cantilevered drive beam 1200 begins to pivot passive beam 1100 about its anchor point 1120. After cantilevered drive beam 1200 moves tip contact flange 1170 away from adjacent tip contact flange 1270, adjacent tip contact flange 1270 is moved out of the path of tip contact flange 1170 by actuating its controlling actuator, as shown in FIG. 5*e*. Cantilevered drive beam 1200 is then allowed to relax to nearly its initial position by discontinuing the drive current, allowing cantilevered drive beam 1200 to cool and shrink. After cantilevered drive beam 1200 has relaxed, adjacent tip contact flange 1270 may be allowed to return to its initial position by discontinuing the current on its actuator, as shown in FIG. 5*f*. Since there is no longer contact between tip contact flange 1170 and adjacent tip contact flange 1270, the switch is now open.

Because of the separation gap 1260 between adjunct silicon portion 1250' and passive beam 1100, the final position of passive beam 1100 does not change, even if the cantilevered drive beam 1200 has undergone some creep, so that cantilevered drive beam 1200 does not return exactly to its original position. The final position of passive beam 1100 will remain the same unless the creep of cantilevered beam 1200 exceeds the separation distance 1260. In general, the cantilevered drive beam may be expected to creep about 0.25 μm along the longitudinal axis, whereas the majority of the creep may occur perpendicularly to the longitudinal axis due to bending stresses in this direction, and may be about 2 μm in this perpendicular direction. Accordingly, a separation distance 1260 of about 0.5 μm along the longitudinal dimension is adequate to ensure that the passive beam 1100 returns to its original position over the lifetime of separated MEMS thermal actuator 1000 or 1000'.

Figure 6:
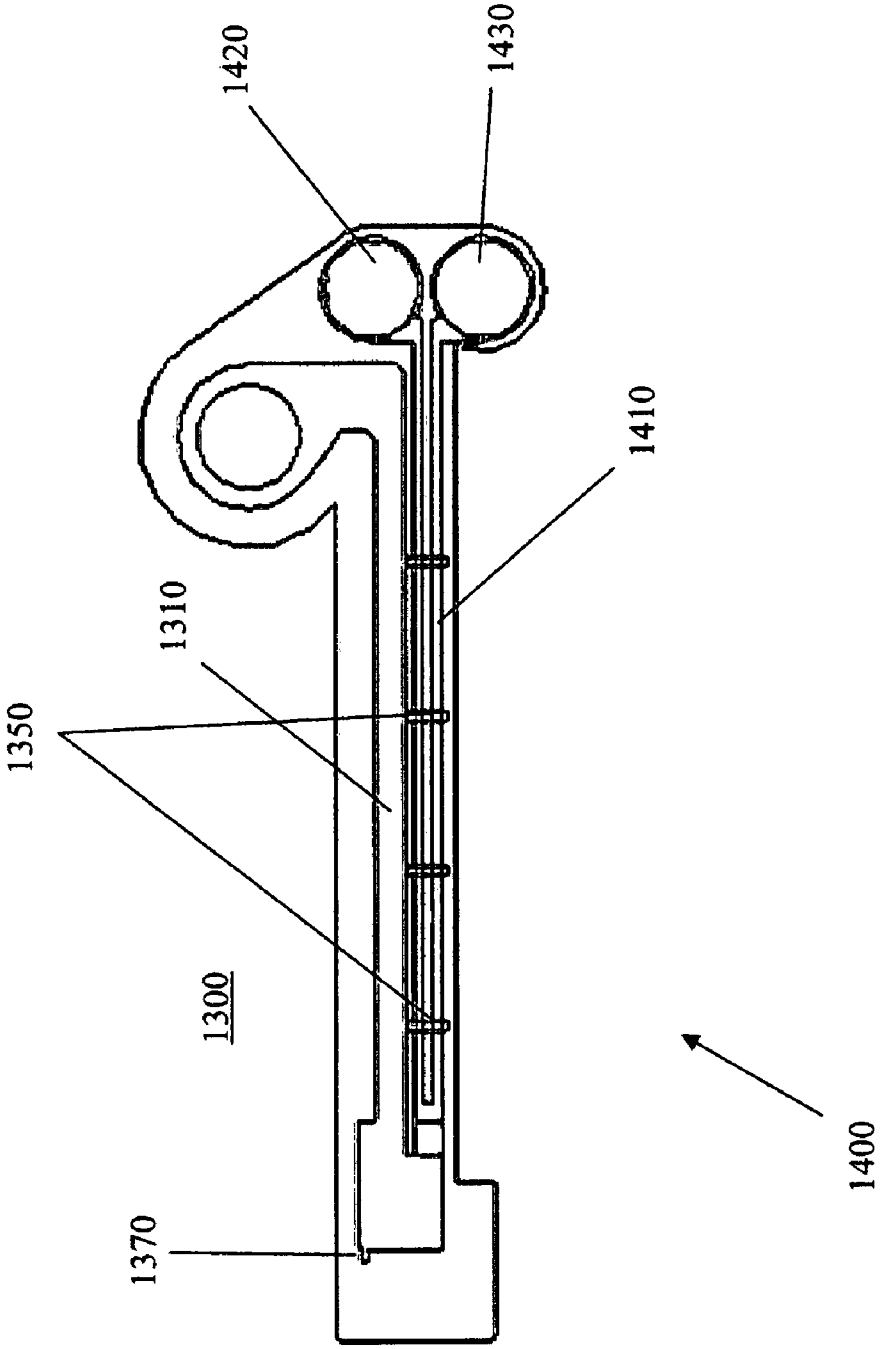
FIG. 6 is a plan view of a separated MEMS thermal actuator, showing the inlaid cantilevered drive beam.

In order to further reduce the tendency of MEMS actuator 1000 to creep, the passive beam 1100 may be made from single crystal silicon, rather than nickel as in the prior art. This embodiment is shown in FIG. 6, which shows separated MEMS thermal actuator 1400. In separated MEMS thermal actuator 1400, the cantilevered passive beam 1310 is formed in the single crystal silicon device layer 1300 of a silicon on insulator substrate. In order to drive the single crystal silicon passive beam 1310, a nickel or nickel alloy may be deposited, or inlaid, in trenches formed in the silicon device layer adjacent to the single crystal passive beam 1310, to form the inlaid cantilevered drive beam 1410. Formed in this way, the inlaid cantilevered drive beam 1410 and the silicon passive beam

1310 move in the same plane. Nickel or a nickel alloy may be chosen as the material for the inlaid cantilevered drive beams 1410 because of its relatively low resistance but high coefficient of thermal expansion, so that the nickel drive beams expand significantly upon heating by the current applied to contact pads 1420 and 1430.

While the embodiment described here is a cantilevered thermal actuator driven by a current, it should be understood that the techniques described here may be applied to other sorts of actuators, such as electrostatic, electromagnetic, electrostatic, and piezoelectric actuators, for example. Accordingly, the materials to be inlaid may be chosen to be appropriate for the actuation mechanism, and may include, for example, gold, gold alloys, nickel, nickel alloys, aluminum, permalloy, platinum, copper, ceramic, and glass.

Figure 7:
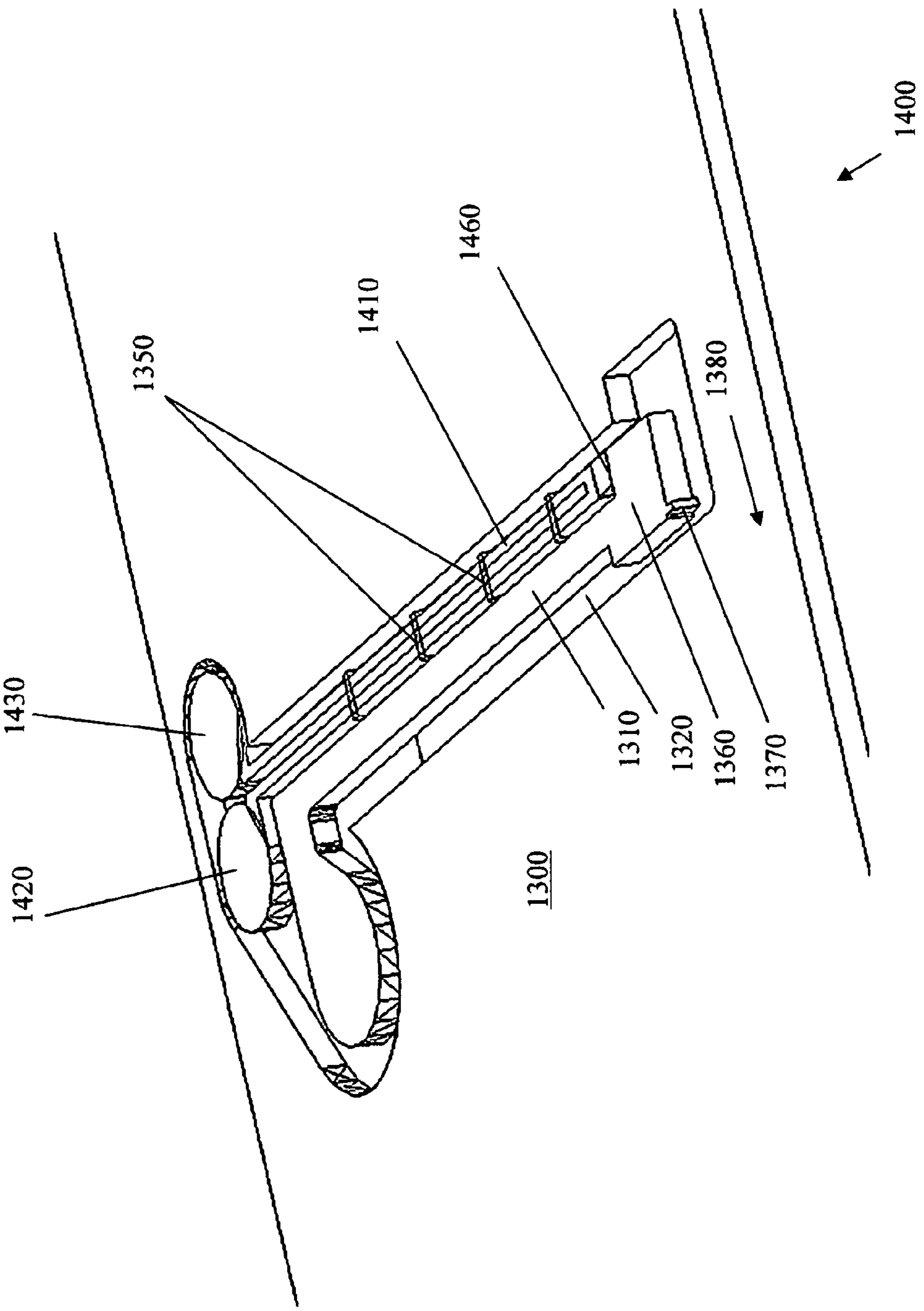
FIG. 7 is a perspective view of a separated MEMS thermal actuator, showing the inlaid cantilevered drive beam in the same plane as the passive cantilevered beam.

In order to depict the relative positioning of inlaid cantilevered drive beam 1410 and silicon passive beam 1310 more clearly, they are shown in a perspective view in FIG. 7. As with the first exemplary embodiment, dielectric tethers 1350 couple the two beam segments of the inlaid cantilevered drive beam 1410, to give them greater strength to resist buckling and other inelastic deformations. A tip contact flange 1370 may also be formed on the silicon passive beam end as shown in FIGS. 6 and 7. While the tip contact flange 1370 is shown on the distal end of the passive beam 1310, extending in the same direction as the cantilevered drive beam 1410, it should be understood that the tip contact may be placed in other positions, depending on how the cantilevered drive beam 1410 is intended to move, and how it is designed to operate in conjunction with another, adjacent cantilevered drive beam, as will be shown in FIG. 10.

The passive beam 1310 and tip contact flange 1370 may move in a trench 1320 formed in the device layer of the silicon-on-insulator substrate, by etching the silicon of the device layer away in this region down to the silicon dioxide insulating etch stop layer of the silicon-on-insulator substrate. The passive beam 1310 and cantilevered drive beam 1410 are subsequently released by etching away most of the silicon dioxide insulating layer beneath them, except at their anchor points. The separated MEMS thermal actuator 1400 may then move when a current is applied to pads 1420 and 1430, heating cantilevered drive beams 1410 until they expand and close gap 1460. At this point, cantilevered drive beam 1410 drives passive beam 1310 in direction 1380.

In order to provide the signal to the switch, a metal electrode trace 1500 with a very low electrical resistance and contact resistance may be deposited over the silicon passive beam and tip contact flange. The purpose of this metal is to route the signal between the contact electrodes for a switch. Such an embodiment is shown in separated MEMS thermal actuator 1600 illustrated in FIG. 8.

Figure 8:
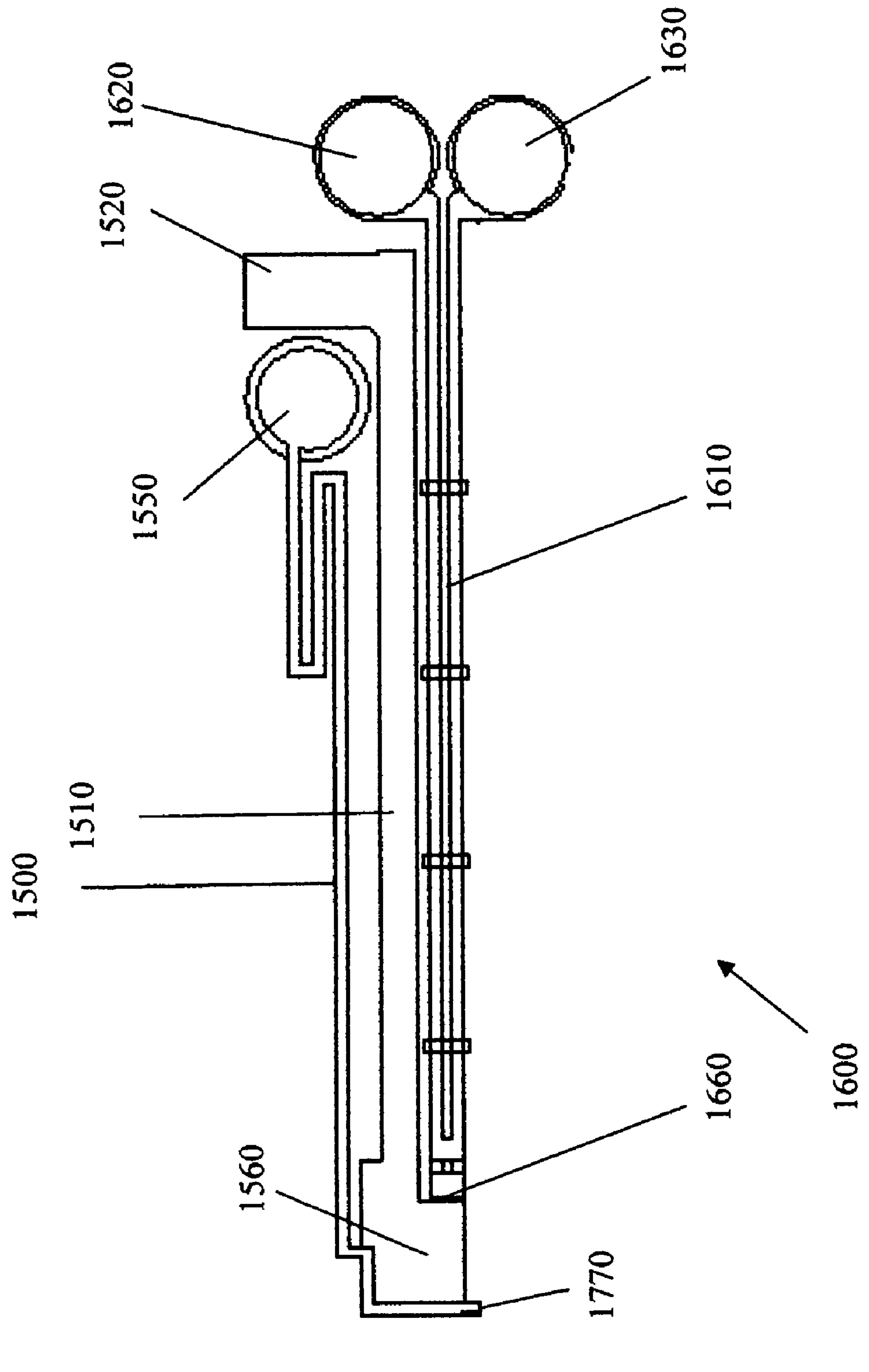
FIG. 8 is a plan view of a separated MEMS thermal actuator with an additional metal electrode structure to carry a signal to be switched.

It is desirable that the metal electrode trace 1500 add little mechanical stiffness to the silicon passive beam 1510, and therefore, the metal electrode trace 1500 may be formed in a serpentine shape such as shown in FIG. 8. The metal electrode trace 1500 may be deposited over another passive silicon beam segment, shown more clearly in separated MEMS thermal actuator 1800 of FIG. 9.

Figure 9:
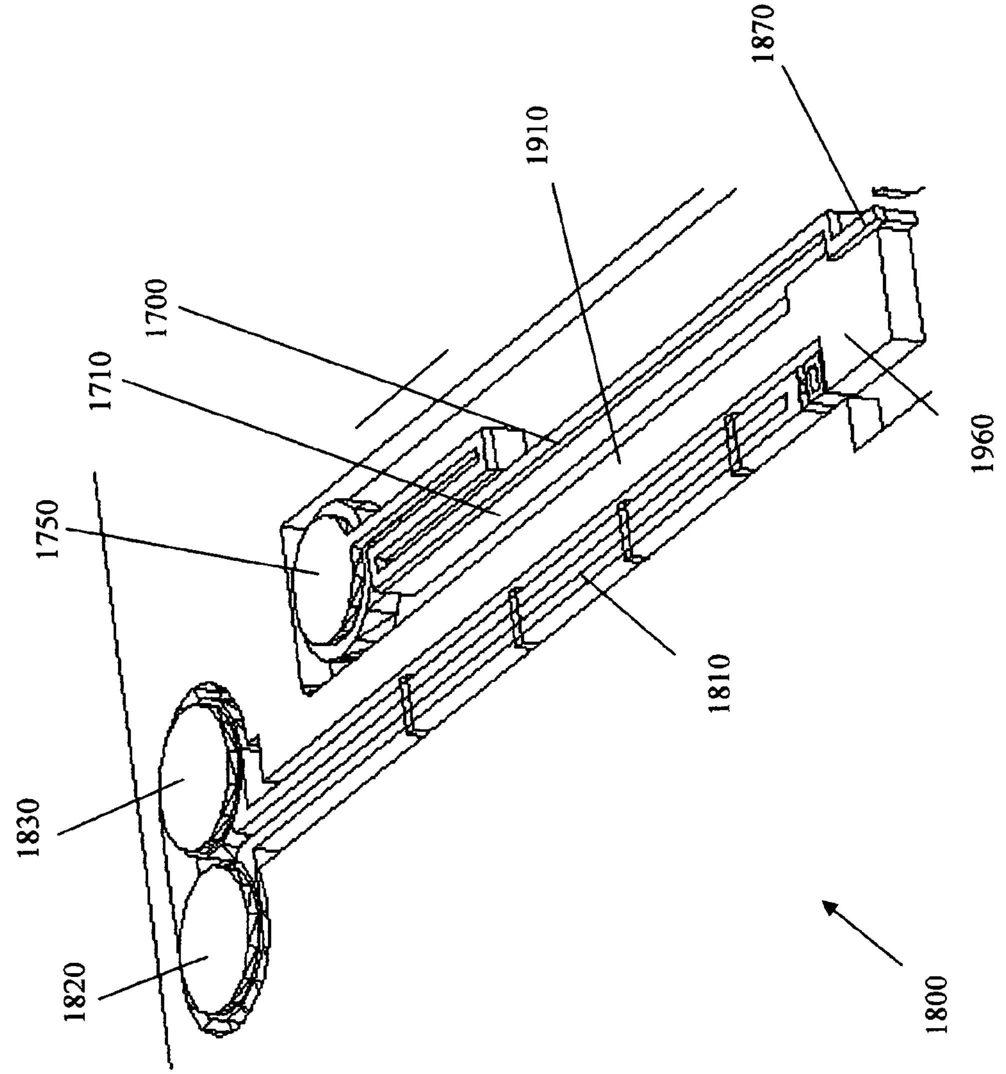
FIG. 9 is a perspective view of a separated MEMS thermal actuator with the additional metal electrode structure carrying the signal to be switched.

FIG. 9 shows separated MEMS thermal actuator 1800 in perspective view. Separated MEMS thermal actuator 1800 is similar to separated MEMS thermal actuator 1600 except for the location and orientation of the tip contact flange 1870. In separated MEMS thermal actuator 1800, the metal electrode trace 1700 is deposited over a passive silicon beam segment 1710 and tip member 1960, analogous to tip members 160 and 260 of FIG. 1, underlying the metal electrode trace 1700. An electrical pad 1750 may be provided to apply the signal to the metal electrode trace 1700. The underlying silicon beam 1710 is shown more clearly in the separated MEMS thermal actuator 1800 shown in perspective in FIG. 9.

Silicon support of metal electrode trace 1700 as in separated MEMS thermal actuator 1600 and 1800 may reduce the possibility of creep for at least two reasons. First, it may resist the metal electrode trace 1700 moving due to stress changes in the material due to heating. It also resists the metal electrode trace 1700 from creeping by providing a restoring force greater than the force needed to bend the metal deformed by creep back to a position very close to its as manufactured position.

Because the metal electrode trace 1700 may be chosen for a low contact resistance, the metal electrode trace 1700 may form the actual switch contact. For this reason, it is important that the metal electrode trace 1700 overhang in regions 1770 or 1870, at least slightly in the region of contact, the underlying silicon beam 1710, so that the silicon beam 1710 does not interfere with the contact between the metal electrode on the tip contact flange 1770 or 1870 and an adjacent metal electrode on an adjacent tip contact flange. This overhanging metal electrode feature 1770 or 1870 is shown more clearly in FIG. 10 as tip contact flanges 2170 and 2270, and one exemplary method for fabricating such an overhanging additional metal electrode feature is described in more detail below.

It should be understood that in other embodiments, the material of the tip contact flanges 1770 and 1870 or electrical pad 1750 may not be the same material which provides the conductive metal electrode trace 1700. The materials of the tip contact flanges 1770 and 1870 and electrical pad 1750 may be chosen to have good contact resistance, whereas the conductive metal electrode trace 1700 material may be chosen for its mechanical properties, such as low stress and low creep properties.

Furthermore, in another alternative embodiment, rather than forming a tip contact flange 1770 overhanging the underlying silicon beam 1710, the entire tip member 1560 or 1960 may be made from the contact material. In this embodiment, the tip member 1560 or 1960 may be made from contact material inlaid in the same device layer as, and contiguous with, the passive silicon beam 1510 or 1910, respectively. This approach may obviate the need for the overhanging metal electrode 1770 or 1870. Alternatively, the tip member 1560 or 1960 may be clad with contact material, or this contact material may be placed in other locations along the sidewalls of the passive beam 1510 or 1910.

The metal electrode material may be any conductive material that has good electrical transport properties and can form a junction with low contact resistance. Suitable materials for the metal electrode may be, for example, gold, nickel, aluminum, gold alloys, nickel alloys, rhodium, ruthenium, platinum, and copper.

The operation of separated MEMS thermal actuators 1600 and 1800 is similar to the operation of separated MEMS thermal actuators 1400 and 1000. By applying a voltage to contact pads 1620 and 1630, for example, a current is driven through cantilevered drive beam 1610, heating the cantilevered drive beam 1610 which expands as a result. The cantilevered drive beam 1610 closes the gap 1660 between the adjunct silicon portion and the tip member 1560 of passive silicon beam 1510, causing passive silicon beam 1510 to pivot about its anchor point 1520 as the cantilevered drive beam 1610 expands.

Figure 10:
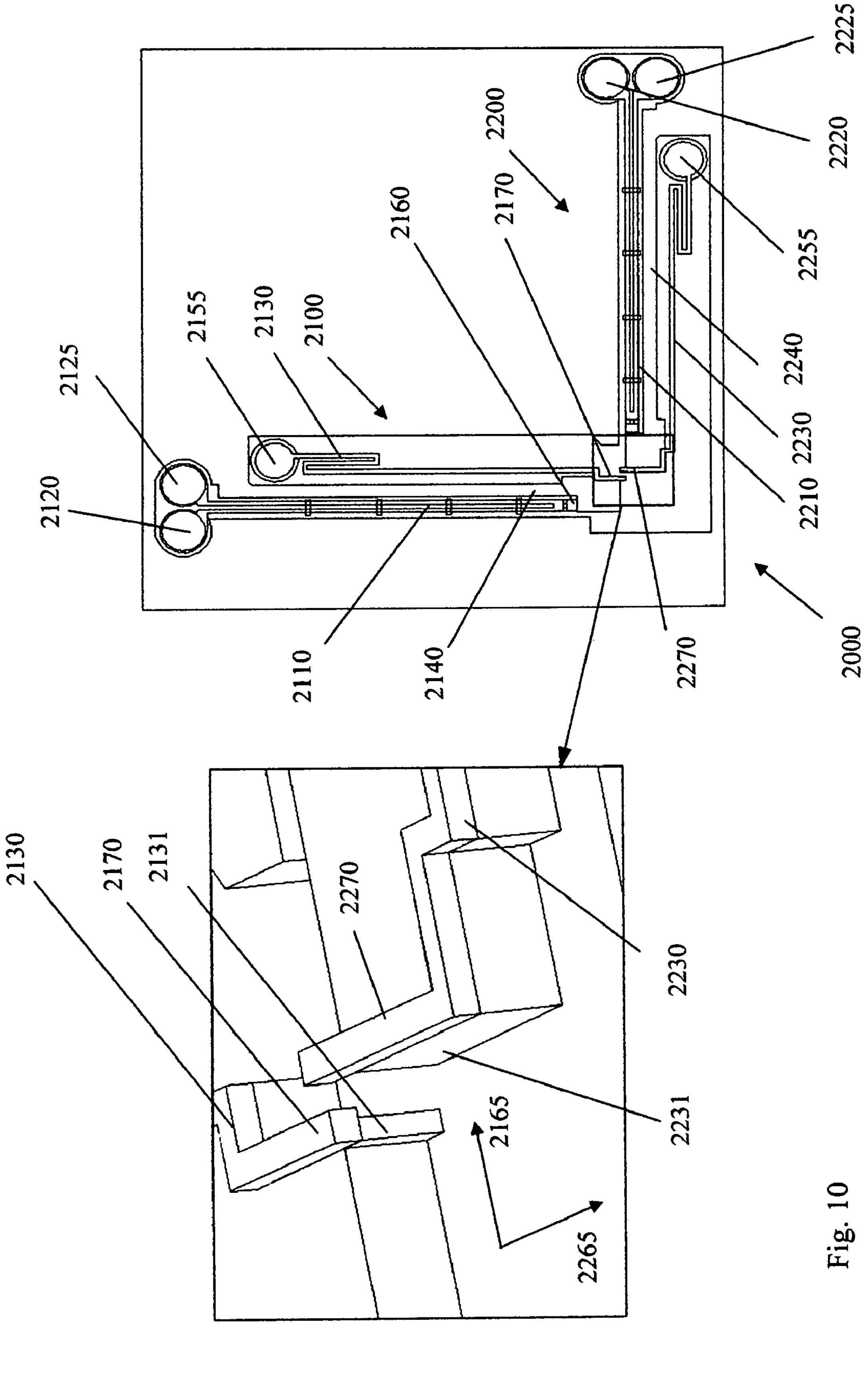
FIG. 10 is a plan view of a MEMS switch using the separated MEMS thermal actuator of FIG. 9, and insert showing detail of the contact region of the MEMS switch.

To form an electrical switch using separated MEMS thermal actuator 1000, 1400, 1600 or 1800, the separated MEMS thermal actuators may be placed adjacent to, and oriented substantially perpendicularly to, another similar or identical separated MEMS thermal actuator. In other exemplary embodiments, only one of the MEMS thermal actuators is a separated MEMS thermal actuator, whereas the other is similar to that shown in the prior art of FIG. 1. One embodiment of such an electrical switch 2000 having two separated MEMS thermal actuators is shown in FIG. 10. In FIG. 10, one separated MEMS thermal actuator 2100 is placed adjacent to, and substantially perpendicular to another similar or identical separated MEMS thermal actuator 2200. The tip contact flange 2170 of separated MEMS thermal actuator 2100 may be oriented adjacent to tip contact flange 2270 of separated MEMS thermal actuator 2200. The relative orientations of tip contact flanges 2170 and 2270 in the contact region are shown in greater detail in the insert of FIG. 10. The insert shows that tip contact flanges 2170 and 2270 are fabricated such that the metal electrode material 2130 overhangs the silicon beam 2131 in the region of the contact flange 2170. This allows the contact to be made only by the metal electrode material 2130 of the contact flange 2170, and so that the silicon beam 2131 does not interfere with this contact.

Using inlay techniques, contact material may also be present along the sidewalls of contact flanges 2170 and 2270 in the region of 2131 and 2231. Furthermore, as mentioned above, inlay techniques can be used to create the whole tip member or contact flange of contact material. Both of these inlay techniques may mitigate the need for overhanging contact material in the contact region.

As with separated MEMS thermal actuators 1000, 1400, 1600 and 1800, separated MEMS thermal actuators 2100 and 2200 are actuated by applying a current through the cantilevered drive beams. For example, cantilevered drive beam 2210 may be driven in direction 2265 by application of a current to contact pads 2220 and 2225. This may be the first step in closing MEMS electrical switch 2000. Then, the second MEMS thermal actuator 2110 may be driven in direction 2165 by applying a current to contact pads 2120 and 2125. The first separated MEMS thermal actuator 2200 may then be allowed to relax by removing the drive current. This may cause the tip contact flange 2270 to return towards its initial position by moving in the opposite direction to 2265. Separated MEMS thermal actuator 2100 may then also be allowed to relax, which causes it to move back to nearly its original position, except for the interference caused by tip contact flange 2270. At this point, tip contact flange 2270 may rest against tip contact flange 2170. Because in this position, the metal electrode structure 2130 is in contact with metal electrode structure 2230, the switch 2000 is closed and the signal may pass from input pad 2155 to output pad 2255. Opening switch 2000 may be accomplished by reversing these steps.

FIGS. 11-26 depict steps in an exemplary method for making separated MEMS thermal actuators 1000, 1400, 1600 or 1800, or MEMS switch 2000. For simplicity, the cross sections are shown in general along the longitudinal axis of one of the inlaid cantilevered drive beams, and not all of the features are included in every cross section.

Figure 11:
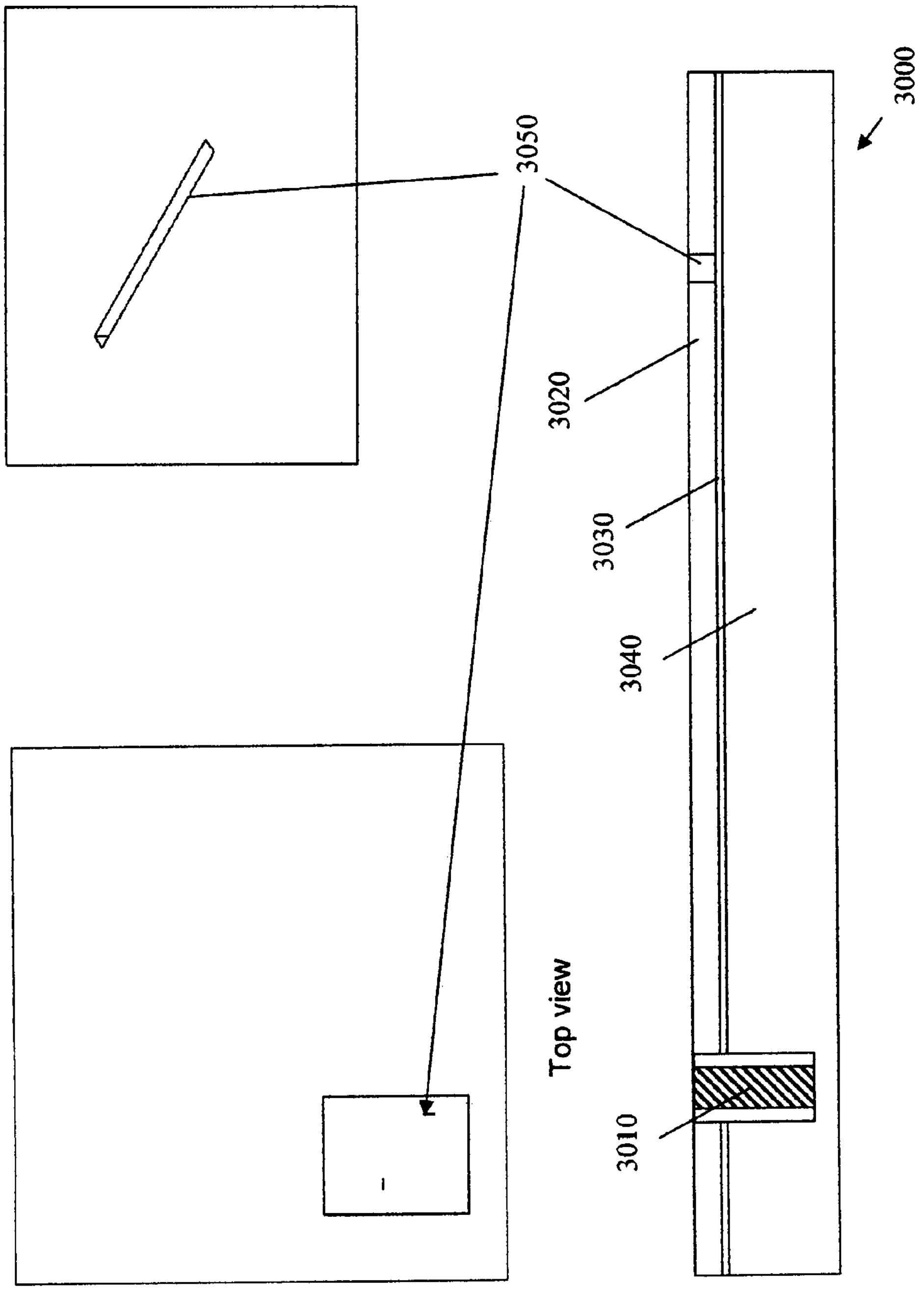
FIGS. 11-22 are cross sectional diagrams of a fabrication sequence for fabricating the MEMS switch of FIG. 10.

The first step, depicted in FIG. 11, is the formation of a pair of slots 3050 in a suitable substrate 3000. As described in greater detail below, these slots 3050 may form the separation gap 1260 between the cantilevered drive beams 1200 and the passive silicon beam 1100.

The substrate 3000 may be a silicon-on-insulator substrate having a thin, silicon device layer 3020, a thin dielectric layer 3030, and a thicker, silicon handle layer 3040. In one exemplary embodiment, the SOI substrate may include a device layer of 12 μm thick single crystal silicon over a 3 μm thick layer of silicon dioxide and 600 μm thick silicon handle layer. This SOI substrate is henceforth referred to as the device substrate 3000.

The passive beams 2140 and 2240 of MEMS switch 2000 may be formed in the single crystal silicon device layer 3020, and the cantilevered drive beams 2110 and 2210 may be nickel or a nickel alloy material plated into, or inlaid into, the silicon device layer 3020. Accordingly, both the silicon passive beams 2140 and 2240 and the inlaid cantilevered drive beams 2110 and 2210 move in the same plane, the plane of the silicon device layer 3020. The passive beams 2140 and 2240 and inlaid cantilevered drive beams 2110 and 2210 may then be released from the substrate by etching the underlying dielectric layer 3030 everywhere except the anchor points beneath the inlaid cantilevered beams 2140, 2240, 2110 and 2210.

The device substrate 3000 may have been previously prepared with a plurality of vias 3010. Further details relating to the formation of the vias may be found in U.S. application Ser. No. 11/482,944, incorporated by reference herein in its entirety. The vias may extend partially through the handle layer 3040 of the device substrate 3000, until the MEMS switch 2000 is completed on the surface of the device substrate 3000.

The vias may be formed by deep reactive ion etching through the device layer 3020, reactive ion etching through the dielectric layer 3030, and deep reactive ion etching through at least a portion of the silicon handle layer 3040, conformally depositing an insulating layer in the etched holes, and plating a conductive material into the holes 3010. After fabrication of the MEMS switch over the device substrate 3000, the MEMS switch 2000 is encapsulated in a lid wafer, and the backside of the device substrate 3000 may be ground down to expose the through wafer vias 3010 which then extend entirely through the thickness of the device substrate 3000. To simplify the drawings however, the vias 3010 are not shown in FIGS. 12-22.

The slots 3050 may be formed by deep reactive ion etching (DRIE) using, for example, a tool manufactured by Surface Technology Systems of Newport, UK. The DRIE may proceed through the thickness of the device layer 3020 to the silicon dioxide layer 3030 of the SOI wafer 3000. Because of the aspect ratio of the through slot formed in the 12 μm thick silicon device layer 3020 by the DRIE process, the minimum width of the slot may be about 0.7-1 μm. Accordingly, if the final width of the slot were determined by the walls created by the DRIE process, their minimum separation would be about 1 μm. However, separations such as the slots 3050 reduce the efficiency of the device, because it reduces the throw of the passive cantilevered beam for a given temperature rise in the inlaid cantilevered drive beams. Accordingly, it is generally desirable to make the slot separation as narrow as possible. For this reason, an additional layer of material 3065 may be grown or deposited on the slots created by the DRIE process, in order to reduce the separation between the walls of the slot 3050, resulting in a narrower slot 3060.

Figure 12:
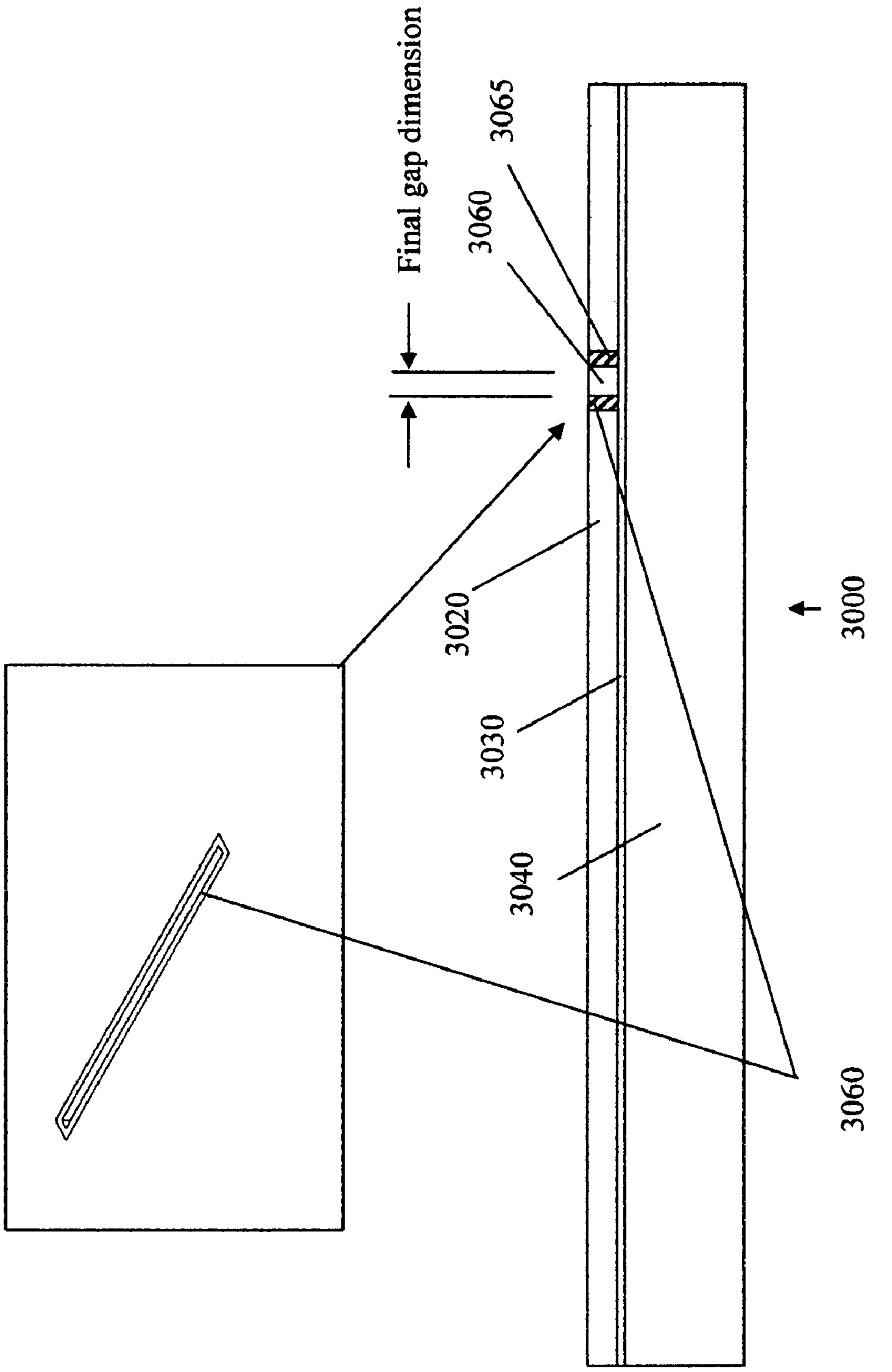

The additional layer of material 3065 may be silicon nitride $Si_3N_4$, which may be deposited using Low Pressure Chemical Vapor Deposition (LPCVD). It should be understood that silicon nitride is only one exemplary embodiment, and that the additional layer of material may be any material with appropriate mechanical characteristics, which adheres to silicon, which resists the hydrofluoric acid etch which will follow later in the process, and whose thickness may be tightly controlled. Such etch-resistant materials may include metals such as lead or platinum and semiconductors such as silicon, deposited by, for example, PECVD. Other materials which may be suitable are polymers such as polyethylene, polypropylene, polymethylpentene (PMP), and photo-patternable polymers such as SU8 developed by IBM Corporation of Armonk, N.Y. The thickness of the layer 3065 may be about 0.25 μm on each side of the slot. The thickness of the layer of additional material 3065 may be tightly controlled by controlling the deposition time of the LPCVD. The device substrate with the slot 3060 and the additional layer of silicon nitride 3065 are shown in FIG. 12. The final gap dimensions of the slot 3060, including additional silicon nitride layer 3065 may be less than about 0.5 μm. In general, the final gap dimensions may be chosen based on a tradeoff between the expected magnitude of the creep in the inlaid cantilevered drive beams, operating temperatures, and the reduction in efficiency of the MEMS thermal actuators 2100 and 2200. The wider gap dimensions reduce the thermal efficiency of the device because there is a commensurate reduction in the magnitude of the deflection of the passive silicon beams 2140 and 2240 for a given amount of current input to the inlaid cantilevered drive beams 2110 and 2210. In this exemplary device, the total unrestricted expansion of the cantilevered drive beams 2110 and 2210 would be about 2.7 um.

Figure 13:
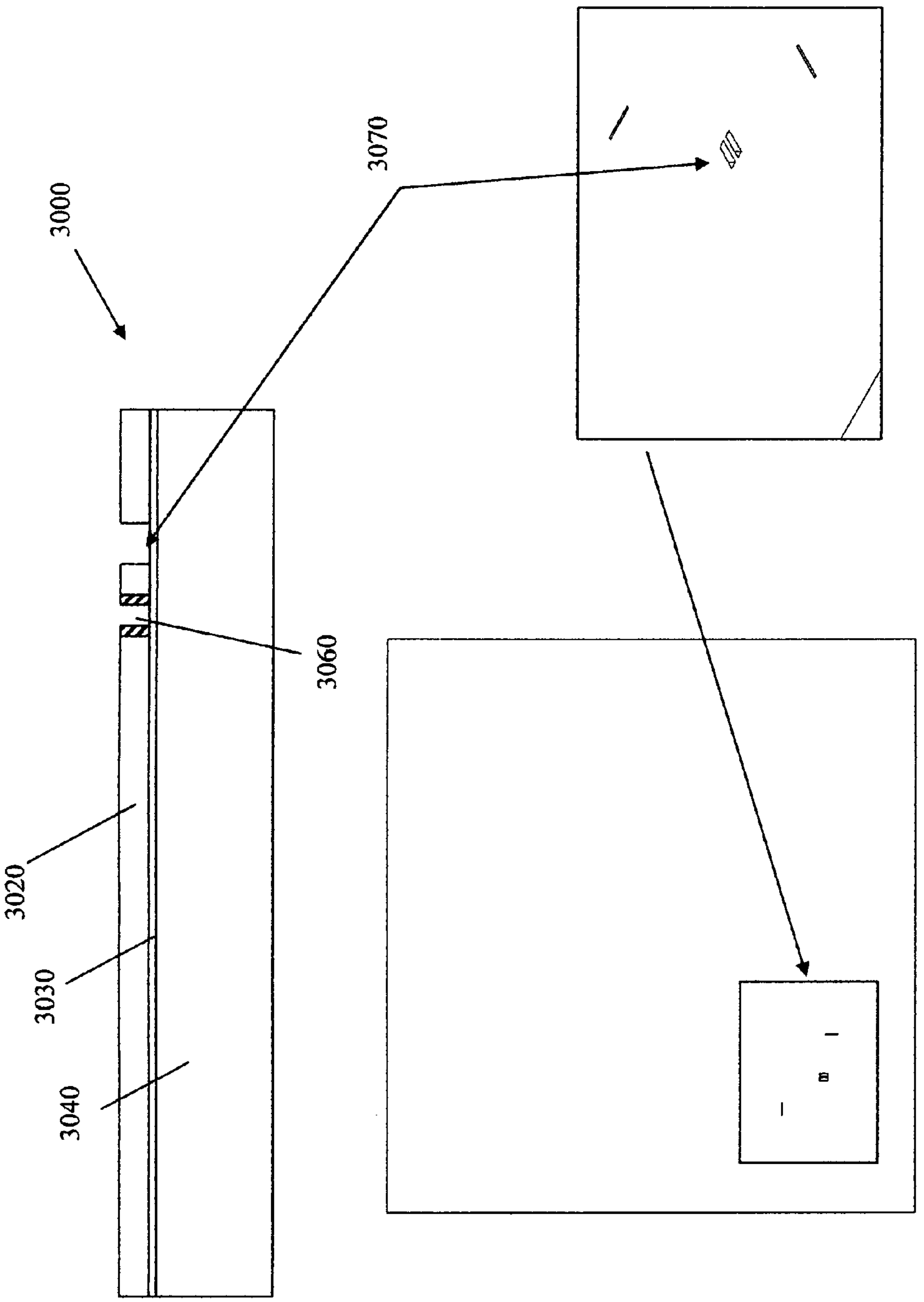

The next step in the fabrication of MEMS switch 2000 may be the preparation of the substrate for the formation of the overhanging metal electrode material 2170 and 2270 at the distal ends of the cantilevered passive beams 2140 and 2240. In order to form this overhang, a pair of panels 3080 may be formed or deposited in a trench 3070 formed in the device layer 3020 of the device substrate 3000, as shown in FIG. 13. These panels 3080 may be placed so that they will be appropriately located at the distal ends of the passive beams 2140 and 2240 when these beams are later formed by deep reactive ion etching. These panels 3080 may be later removed when the passive beams 2140 and 2240 are released from the oxide layer 3030 of the device substrate 3000. The panels 3080 may be made of any material which is readily removed in the process used to remove the oxide layer 3030, or a material which can be selectively removed in a separate step during the release process. Such suitable materials may include, but are not limited to, silicon dioxide, copper, or aluminum. These alternative materials, such as copper and aluminum, may require an inlay process themselves, such as sputtering onto the sidewalls of the panel slots 3070. Chemical mechanical planarization may then be required to remove any material from the top surface of the substrate 3000.

Figure 14:
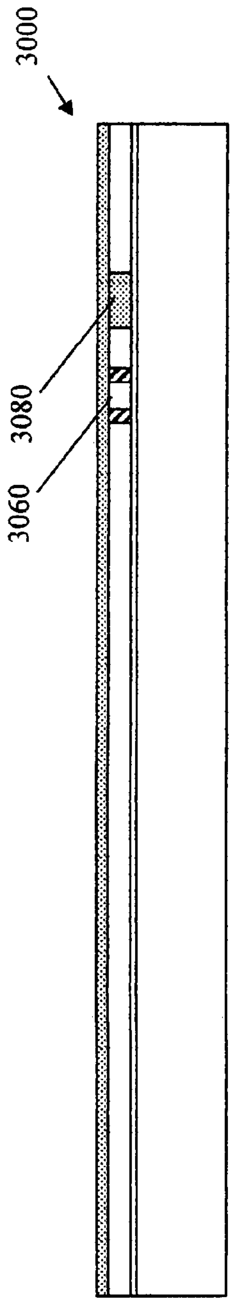
Figure 15:
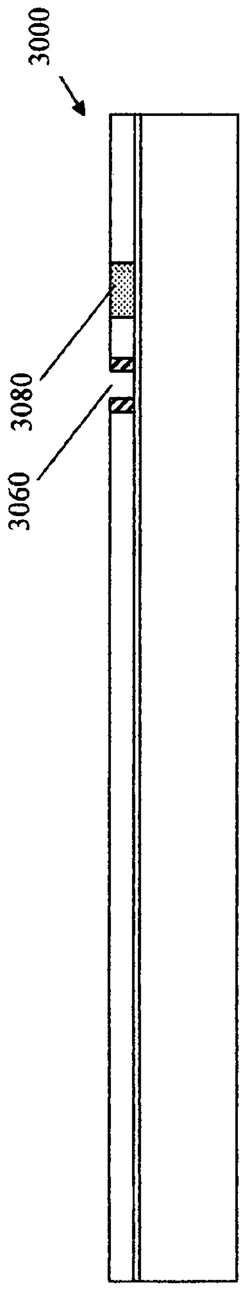

When the panels 3080 are appropriately placed, their removal will leave the additional metal electrode material deposited over these panels and the passive silicon beam, extending beyond the silicon beam as desired. The process of forming the panels 3080 is depicted in FIGS. 14 and 15. For example, oxide panels may be formed as described below.

While fabricating the oxide panels 3080, the silicon dioxide may be formed or deposited using standard thermal oxidation techniques, PECVD deposition or sputtering, and will be present over the entire surface of the device substrate 3000. After appropriate cleaning of the substrate, standard deposition or thermal oxidation processes may be performed. In either case, it may be advantageous to grow or deposit a thick enough layer of oxide to close the panel trench. For PECVD deposition or sputtering, a higher deposition rate at the top of the trench may leave the bottom of the trench partially filled. Optimization of the process may be required to ensure that this void lies below the plane of the substrate surface to avoid leaving an open trench after any possible subsequent planarization processes. The formation of the oxide panels 3080 is depicted in FIG. 14.

The next step in the fabrication of the MEMS switch 2000 may be the planarization of the top surface of the device substrate 3000 by, for example, chemical mechanical polishing (CMP). This may remove the silicon dioxide material from the surface of the substrate 3000, while leaving the oxide panels 3080 in the trenches 3070. The CMP process is depicted in FIG. 15.

Figure 16:
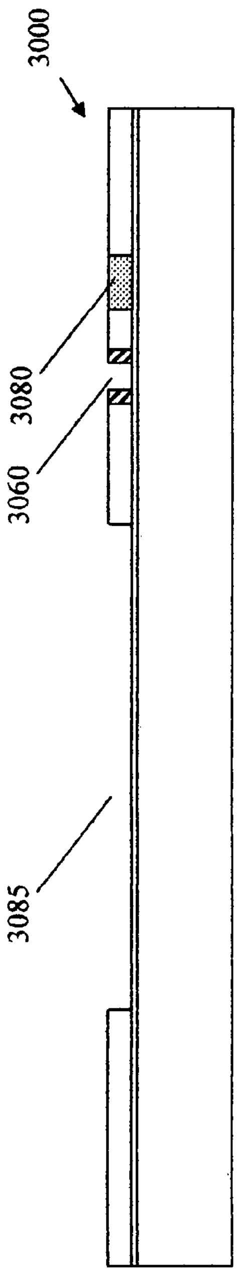
Figure 17:
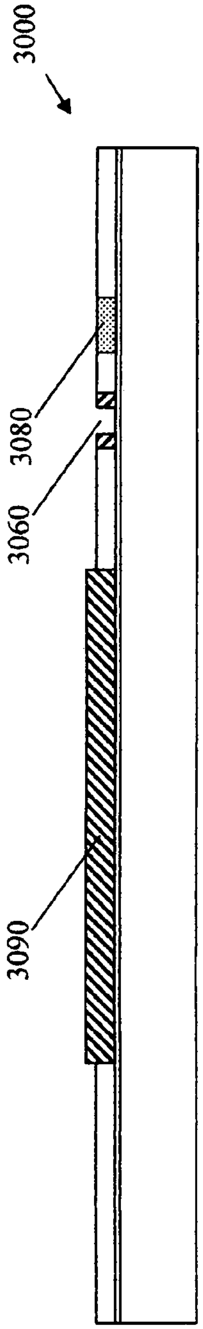

The next step in the fabrication of the MEMS switch 3000 may be the etching of another trench 3085 in which the inlaid material of the cantilevered drive beams will subsequently be deposited. The trench 3085 may be formed by deep reactive ion etching (DRIE). The deep reactive ion etching may proceed through the entire thickness of the SOI device layer 3020, which may be about 12 μm thick, and stopping on the underlying silicon dioxide layer 3030. The length of the trench may be, for example, about 200 μm long and about 10 μm wide, in order to form an inlaid cantilevered drive beam of that length and width. The device substrate 3000 with the trench 3085 formed in it is shown in FIG. 16. It should be understood that the dimensions given here are exemplary only, and that different dimensions may be chosen depending on the requirements of the application.

A seed layer (not shown) may then be deposited over the trench 3085 and substrate surface 3000, which will serve as the plating base for subsequent plating of the material for the inlaid cantilevered drive beams 2110 and 2210. The seed layer may be chromium (Cr) and/or gold (Au), deposited by chemical vapor deposition (CVD) or sputter deposition to a thickness of 100-200 nm. Photoresist may then be deposited over the seed layer, and patterned by exposure through a mask corresponding to the desired width and length of the inlaid cantilevered drive beams 2110 and 2210. Since these techniques are well known in the MEMS art, these steps are not depicted in the figures or described further.

The inlaid cantilevered drive beam material 3090 may then be plated into the trench 3085 just formed. The cantilevered beam material 3090 may be, for example, nickel or a nickel alloy. Details as to the plating bath materials and process parameters which may be used for plating the nickel or nickel alloy may be found in U.S. patent application Ser. No. 11/386,733, incorporated by reference herein in its entirety. The condition of the device substrate 3000 at this point in the processing is shown in cross section in FIG. 17.

Figure 18:
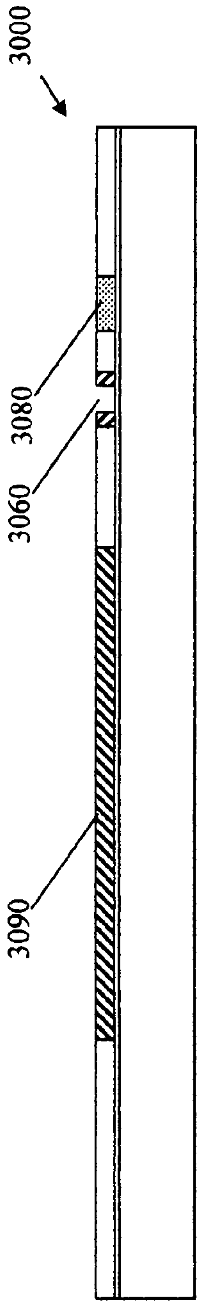
Figure 19:
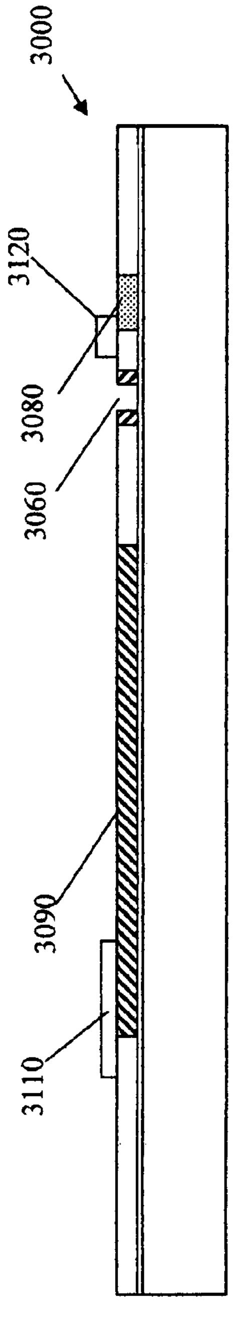

The plating process may plate the nickel material into the trench and over the top surface of the device substrate 3000. The photoresist and seed layer (not shown) may then be stripped from the substrate 3000. The excess nickel material deposited on the top surface of the device substrate 3000 may then be removed by chemical mechanical polishing, as shown in FIG. 18. The inlaid cantilevered drive beams 2110 and 2210 which are formed from the plated inlaid material are thereby formed in the plane of the device layer 3020 of the device substrate 3000.

The process then proceeds to the formation of the metal contact structures 2120, 2125, 2220, 2225, 2130 and 2230 from the additional metal. The additional metal contact material may form the connection 3110 between the vias and the inlaid cantilevered drive beams, corresponding to 2120, 2125, 2220 and 2225 in FIG. 10, as well as the overhanging metal electrode material 3120, corresponding to 2170 and 2270 in FIG. 10. This step may also form the metal electrode traces 1500, 1700, 2130 and 2230. As with the plating for the inlaid cantilevered drive beams 2110 and 2210, the plating for the additional metal contact material may be preceded by the deposition of a seed layer. Photoresist may then be deposited over the seed layer and patterned photolithographically to form a stencil for plating the additional metal contact material 3110 and 3120 in the desired areas. As before, since these techniques are well known in the art, they are not depicted or described further.

The additional metal contact material 3110 and 3120 may then be deposited over the substrate surface 3000. In one exemplary embodiment, the additional metal contact material 3110 and 3120 may be gold (Au) electrodeposited to a thickness of about 4 μm. After electrodeposition, standard resist strip and seed layer etch techniques can be used to remove the seed layer from areas where it is not required.

If needed or desired, the deposition of the additional metal contact material 3110 and 3120 may be preceded by the formation of a silicon nitride layer over the surface of the device substrate 3000. This may allow the signal lines formed from the additional metal contact material 3110 and 3120 to be electrically isolated from the passive beams 2140 and 2240 as well as the cantilevered drive beams 2110 and 2210, which are later formed in the device substrate 3000.

Figure 20:
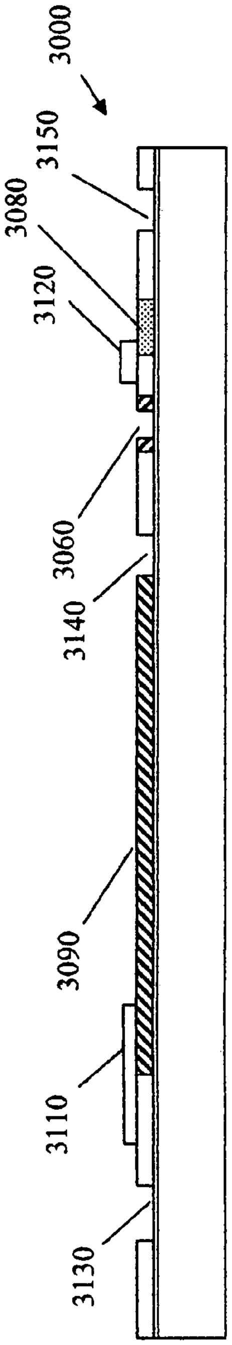

The process now turns to the formation of the passive beams 2140 and 2240 in the device layer 3020 of the silicon-on-insulator substrate 3000. The surface may first be covered with photoresist and exposed through a mask with the pattern of the outlines of passive beams 2140 and 2240. In areas where all silicon is to be removed from the inlaid materials, such as around the inlaid cantilevered drive beam 3090, this photoresist mask can be set back from the edge of the inlaid materials so that the material itself acts as the etch mask. The device layer 3020 may then be deep reactive ion etched (DRIE) to remove the areas of the device layer 3020 not corresponding to the passive beams 2140 and 2240. As with the previous etching step, the DRIE may be performed by a tool manufactured by Surface Technology Systems of Newport, UK, for example. The DRIE step leaves voids 3130, 3140 and 3150 over the silicon dioxide layer 3030 of the silicon-on-insulator substrate 3000, as shown in FIG. 20. Voids 3130 and 3150 may correspond to the area beyond the base of the vias 2120 and 2125 and the area beyond the distal end of the passive beams 2140 and 2240 in FIG. 10, which provides clearance for the movement of the passive beams 2140 and 2240. The void 3140 may correspond to the separation 1245 between the inlaid cantilevered drive beam 1210 and 1220 and the adjunct silicon member 1250 in FIG. 4. This gap 3140 may be subsequently filled with a dielectric material to provide electrical isolation 1245 between the inlaid cantilevered drive beams 1210 and 1220 and the passive silicon beam 1100, as shown in FIG. 4. The photoresist may be set back from the metal inlay features to allow the etching to remove all the silicon up to these features. These metals will not be etched or be damaged during the DRIE process.

Figure 21:
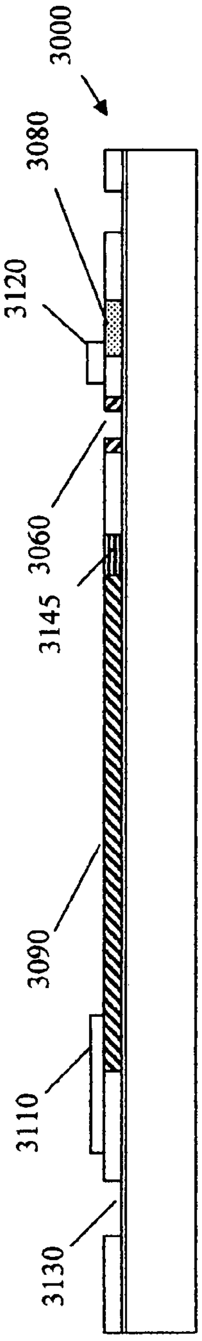

In FIG. 21, the surface of the device substrate 3000 is coated with a photopatternable polymer 3145, such as photoresist. The photopatternable polymer is then exposed in areas where the photopatternable polymer is desired as a permanent structure, such as insulator 3145 in gap 3140. The photopatternable polymer 3145 is then developed, removing the photopatternable polymer from all areas where it is not wanted, as shown in FIG. 21. Polymer 3145 may provide the insulating material 1245 between the inlaid cantilevered drive beams 1210 and 1220 and the adjunct silicon portion 1250 and passive silicon beam 1100, as was shown in FIG. 4. Steps may be taken throughout this process to remove any native oxide layer on the structures such as silicon beams and inlay metal. This oxide would be removed during the final release process thus creating unwanted separation of the structures.

Figure 22:
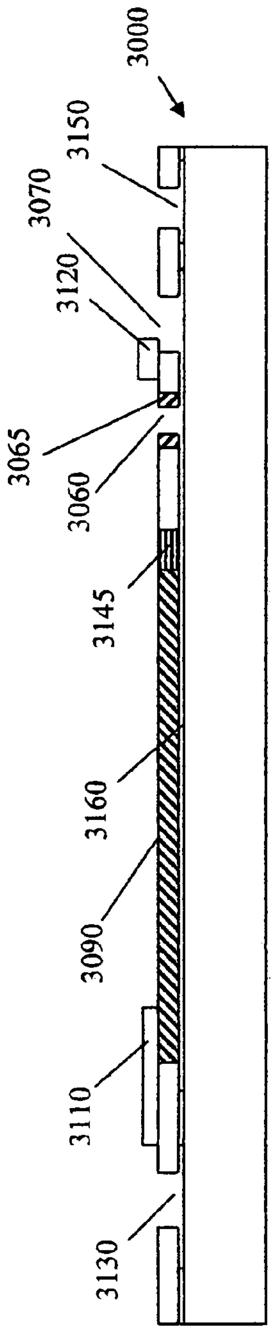

The next step in the fabrication of MEMS switch 2000 may be the etching of the oxide layer 3030 from beneath the cantilevered beams, in order to release the beams and enable their movement. The oxide etch may be performed using a 6:1 buffered oxide etch (BOE), which is a volume ratio of six parts ammonium fluoride $NH_4F$ to one part hydrofluoric acid (HF). The etching may proceed for about 30 minutes to remove the 3 μm thick layer of silicon dioxide, and then for more time as required to fully undercut and release the required features of the device. The amount of time required will be dependent upon the specific design. The condition of the device substrate 3000 after removal of the silicon dioxide layer 3030 is shown in FIG. 22.

Importantly, the buffered oxide etch also removes the oxide panels 3080, if any, which were formed in the first step of the process. The removal of the oxide leaves the gold contact material 3120 overhanging the silicon passive beam to which it is affixed. This will allow the gold contacts 2170 and 2270 to touch one another without interference from the silicon passive beam 2140 and 2240, as was illustrated in the insert of FIG. 10. However, as mentioned above, if the entire tip member 1560 or 1960 is made or clad with the contact material, no overhang may be required.

If necessary, another exemplary method may be used to form the overhanging additional metal electrode material 3120 over the silicon passive beam. In this exemplary method, the overhanging metal electrode material may be formed by deep reactive ion etching the passive beam without applying a polymer at the outset of the deep reactive ion etching process, so that the deep reactive ion etching is less directional and more isotropic at the outset. This may result in an overetching of the upper portions of the single crystal silicon walls on the passive beam 2140 and 2240. As a result, the additional metal contact material 2170 and 2270 deposited on the silicon passive beams 2140 and 2240 may overhang the silicon passive beams 2140 and 2240, as was shown in FIG. 10. Separating the passive beam etch process into two steps would allow for application of such an etch to the upper portion of the passive beam while etching the remainder of the passive beam with a more traditional DRIE etch to allow for better dimensional tolerance of the critical portions of that beam.

Removal of any oxide panels 3080 and the underlying oxide layer 3030 essentially completes the fabrication of the device, so that it may now be encapsulated with a lid. Two embodiments of the lid encapsulation are described below, and illustrated in FIGS. 23-26.

Figure 23:
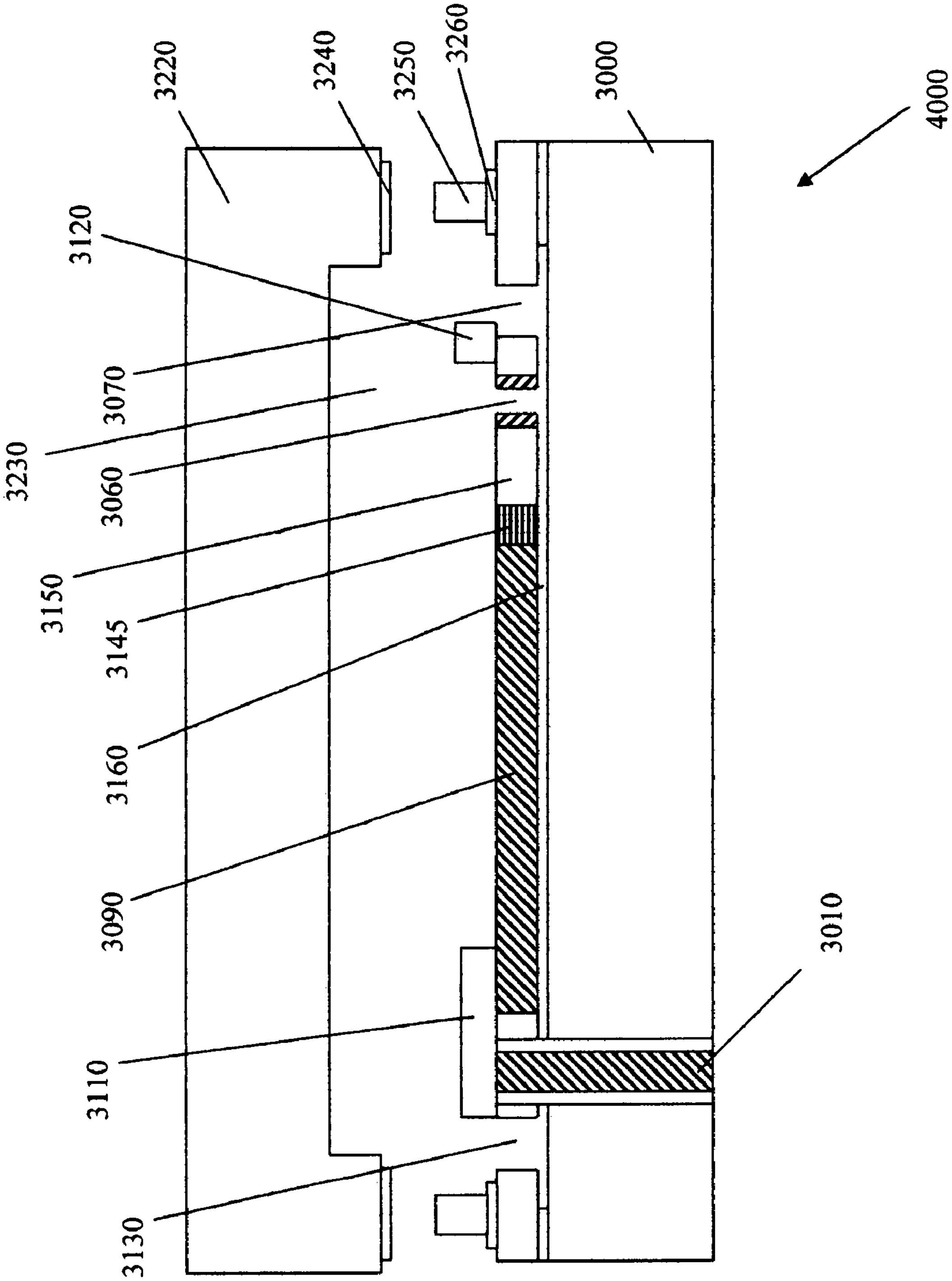
FIG. 23 is a cross sectional view of the MEMS device substrate with a lid wafer.

The first embodiment of the encapsulation scheme is illustrated in FIG. 23, which shows the encapsulated MEMS switch 4000 in cross section, with MEMS device substrate 3000 adjacent to a lid wafer 3220. The lid wafer 3220 may have a device cavity 3230 formed therein, which is a relieved area providing clearance for movement of the cantilevered beams 3090 of separated MEMS thermal actuator. The device cavity 3230 may have been formed by an etching process, and additional details of an etching process which may be used to form a device cavity 3230 in a lid wafer 3220 are set forth in U.S. patent application Ser. No. 11/211,625, incorporated by reference herein in its entirety.

The lid wafer 3220 may be bonded to the MEMS device substrate 3000 using a low temperature bond, so that the metal layers, especially the nickel inlaid cantilevered drive beams 3090 are not damaged by high temperatures. One embodiment of such a low temperature bond may be a metal alloy bond, formed from, for example, gold 3240 and 3260 deposited on one or both surfaces and indium 3250 deposited on the other surface, adjacent to or between the gold features 3240 and 3250. The gold and indium may be deposited using a stencil, and the method of deposition and alloying are described in further detail in U.S. patent application Ser. No. 11/211,622, incorporated by reference herein in its entirety.

Figure 24:
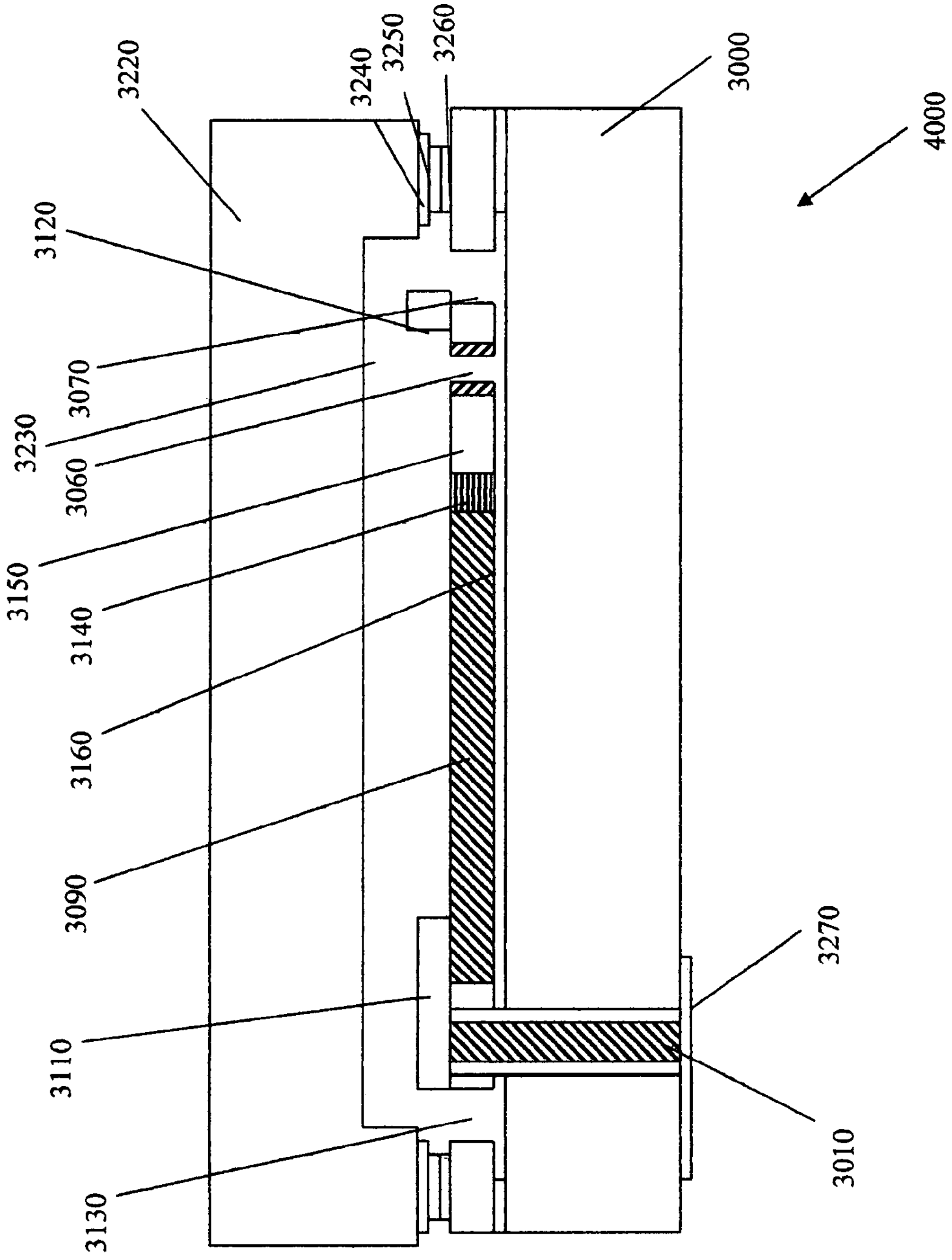
FIG. 24 is a cross sectional view of the MEMS device substrate bonded to the lid wafer, with a bonding pad deposited on the MEMS device substrate.

By applying pressure between the lid wafer 3220 and the MEMS device substrate 3000, while heating the lid wafer 3220 and MEMS device substrate 3000 to a temperature beyond the melting point of the indium, the indium may flow into the gold and form an alloy. The alloy may be, for example, $AuIn_x$, where x is about 2, which has a higher melting point than either the indium or the gold constituents. The alloy therefore solidifies instantly, forming a hermetic seal around the MEMS switch 4000. The condition of the lid wafer 3220 and MEMS device substrate 3000 after bonding is illustrated in FIG. 24. The hermetic bond may seat in an insulating environment, such as a sulfur hexafluoride ($SF_6$) gas environment, which resists arcing between the high voltage leads within the MEMS switch 2000 or 4000. It should be understood that the $SF_6$ environment is only one exemplary environment, and other environments may also be used, including inert gases, carbon dioxide, vacuum and partial vacuum.

After bonding the lid wafer 3220 to the MEMS device substrate 3000, the SOI device substrate 3000 carrying the MEMS switch 2000 may be ground back to reveal the blind end of the vias 3010 which were formed in the front side of the device wafer. Additional details regarding the grinding procedure may be found in U.S. patent application Ser. No. 11/482,944, which was incorporated by reference herein in its entirety. Electrical access to the encapsulated MEMS switch 4000 may then be provided by depositing a conductive layer 3270 of a metal material, such as gold. The condition of the lid wafer 3220 and the MEMS device substrate 3000 after back grinding and deposition of the conductive layer 3270 is shown in cross section in FIG. 24. If required for device function, an insulating layer maybe deposited between the ground and polished silicon surface and any conductive metallurgy. As before, since these techniques are well known in the art, they are not depicted or described further.

Figure 25:
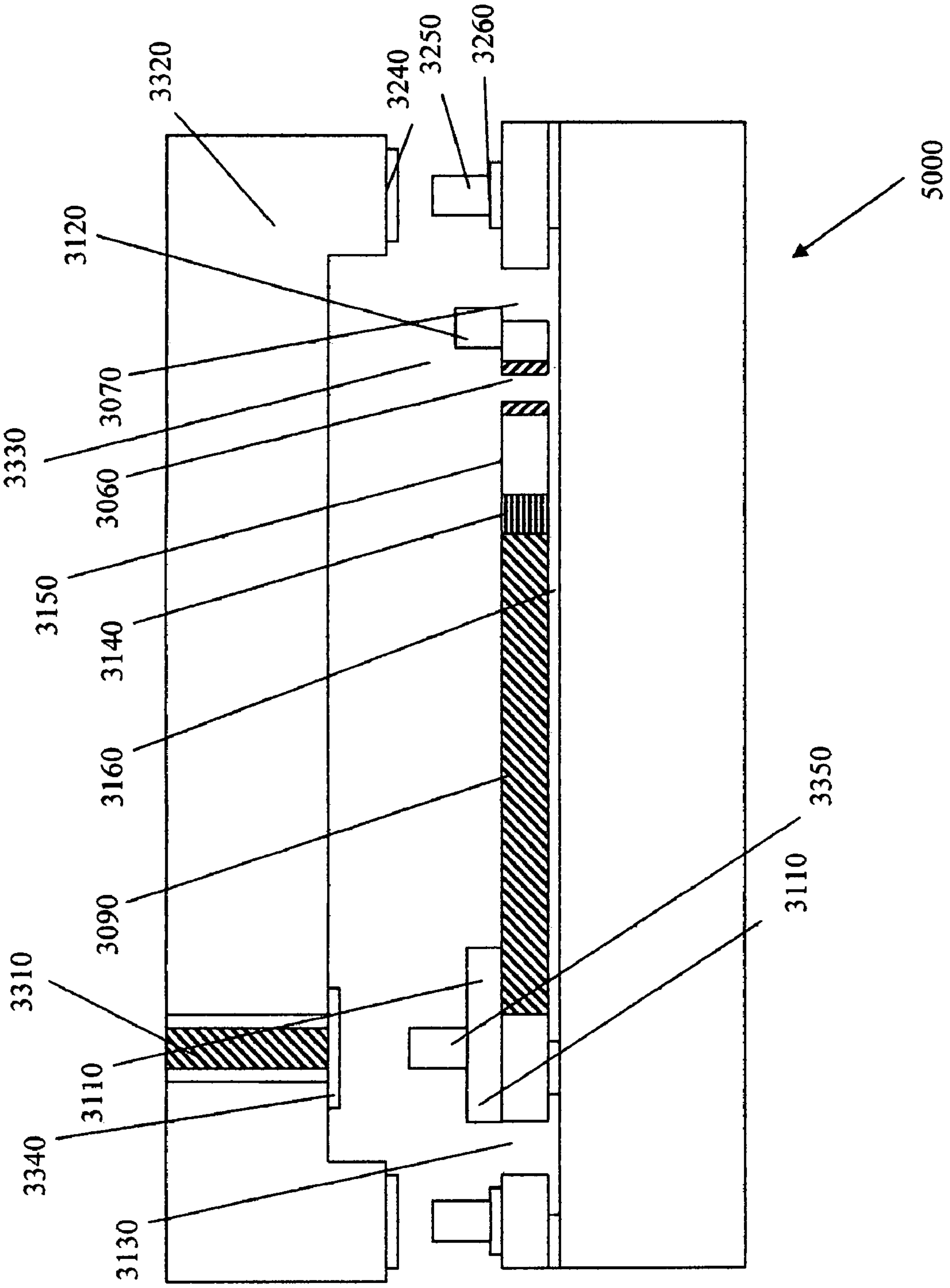
FIG. 25 is a cross sectional view of a second exemplary embodiment of bonding a lid wafer to a device substrate, wherein the electrical vias are formed in the lid wafer.

A second embodiment for encapsulation of the MEMS switch 5000 is shown in FIG. 25. In the second embodiment, the electrical vias 3310 which provide access to the MEMS switch may be formed in the lid wafer 3320. In this embodiment, the layer of gold 3340 which will participate in the bonding is also deposited over the exposed end of the via 3310, which will be disposed inside the device cavity 3330. A corresponding layer of indium 3350 is plated over the gold film 3110 formed over the inlaid cantilevered drive beams 3090. The alloy resulting from the combination of the gold layer 3340 and the indium layer 3350 will provide electrical access to the cantilevered drive beams 3090, and may deliver the current required to heat the cantilevered drive beams 3090.

Figure 26:
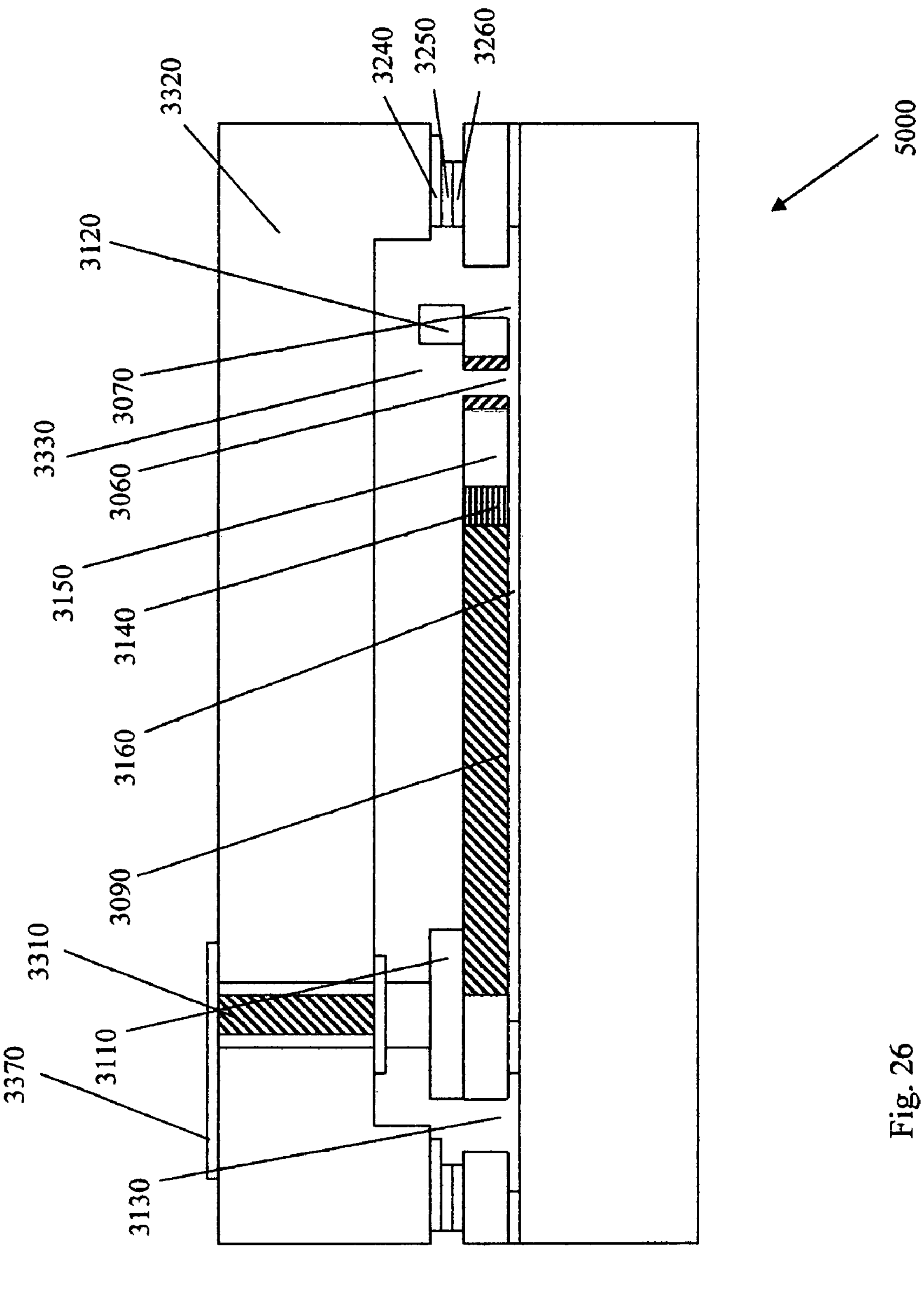
FIG. 26 is a cross sectional view of the second exemplary embodiment after bonding the lid wafer to the device substrate and depositing the bond pads on the exterior of the device cavity.

The lid wafer 3320 is then pressed against the MEMS device substrate 3000 and heated to beyond the melting point of the indium 3250 and 3350. The molten indium then forms the $AuIn_x$ alloy which seals the device as shown in FIG. 26. The lid wafer 3320 may then be background to expose the end of the blind vias, which then provide electrical access through the lid wafer 3320. An external bonding pad 3370 may then be deposited over the exposed end of the through wafer via 3310, to provide electrical access to the encapsulated MEMS switch. The external bonding pad 3370 may carry the operating current which flows through the inlaid cantilevered drive beams 3090, 2110 and 2210 that operate the MEMS switches 3000 and 2000, respectively. If required for device function, an insulating layer maybe deposited between the ground and polished silicon surface and any conductive metallurgy. As before, since these techniques are well known in the art, they are not depicted or described further.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while a MEMS electrical switch is described, it should be understood that the MEMS thermal actuator may be applied to any of a number of additional devices, such as pistons, valves, optical and fluidic devices, in which low creep or repeatable performance is desired. Accordingly, the exemplary implementations set forth above, are intended to be illustrative, not limiting.

What is claimed is:

1. A micromechanical actuator, comprising:

a silicon-on-insulator substrate having a device layer formed in a plane;

a metallic material inlaid in the plane of the device layer and configured to move substantially in the plane of the device layer;

a silicon member formed from the device layer of a silicon-on-insulator substrate, configured to move substantially in the plane of the device layer, wherein movement of the inlaid material drives movement of the silicon member.

2. The micromechanical actuator of claim 1, wherein the inlaid material moves about a proximal end, the proximal end being anchored to the silicon-on-insulator substrate, when the inlaid material is heated.

3. The micromechanical actuator of claim 2, wherein the inlaid material extends substantially through the plane of the device layer, and is coupled at its distal end by a dielectric tether to an adjunct silicon portion.

4. The micromechanical actuator of claim 3, wherein the adjunct silicon portion is separated from the silicon member by an air gap in a quiescent state, and the inlaid material closes the air gap and drives movement of the silicon member when the micromechanical actuator is energized.

5. The micromechanical actuator of claim 4, wherein surfaces which define the air gap comprise at least one of silicon nitride, silicon dioxide, an inlaid metal, an inlaid semiconductor and a hydrofluoric acid etch-resistant polymer.

6. The micromechanical actuator of claim 1, further comprising a metal contact electrode which overhangs a wall on a distal end of the silicon member, the wall of the silicon member being disposed perpendicularly with respect to the plane of the device layer.

7. The micromechanical actuator of claim 1, further comprising a metal contact electrode inlaid in the plane of the device layer, and contiguous with a distal end of the silicon member.

8. A micromechanical switch comprising at least one micromechanical actuator of claim 1 and at least one additional micromechanical actuator, each micromechanical actuator configured to move substantially perpendicularly with respect to the other, in order to make contact between contact electrodes disposed on the distal ends of the micromechanical actuators.

9. An array of micromechanical switches, comprising at least one of the micromechanical switches of claim 1.

10. The array of micromechanical switches of claim 9, wherein electrical contact to the inlaid material is made by vias formed in the silicon-on-insulator substrate.

11. The array of micromechanical switches of claim 10, further comprising a lid wafer with at least one device cavity formed therein, which encloses the array of micromechanical switches.

12. The array of micromechanical switches of claim 11, wherein electrical contact to the micromechanical switches is made by vias formed through the thickness of the lid wafer.

13. The micromechanical actuator of claim 1, wherein, wherein the inlaid metallic material comprises at least one of a magnetically permeable material, gold, a gold alloy, nickel, a nickel alloy, aluminum, permalloy, platinum, and copper.

14. The micromechanical actuator of claim 6, wherein the contact electrode comprises at least one of gold, a gold alloy, rhodium, ruthenium, platinum, nickel, a nickel alloy, aluminum and copper, and the silicon member comprises single crystal silicon.

15. The micromechanical actuator of claim 1, wherein a top surface of the inlaid metallic material is substantially flush with a top surface of the device layer.

16. A micromechanical actuator, comprising:

a silicon-on-insulator substrate having a device layer formed in a plane;

a material inlaid in the plane of the device layer and configured to move substantially in the plane of the device layer;

a silicon member formed from the device layer of a silicon-on-insulator substrate, configured to move substantially in the plane of the device layer, wherein movement of the inlaid material drives movement of the silicon member, wherein the silicon member is clad with a metal contact material.

* * * * *